United States Patent
Iwase

(10) Patent No.: US 9,362,892 B2
(45) Date of Patent: Jun. 7, 2016

(54) SCANNING SIGNAL LINE DRIVE CIRCUIT, DISPLAY DEVICE HAVING THE SAME, AND DRIVING METHOD FOR SCANNING SIGNAL LINE

(75) Inventor: Yasuaki Iwase, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 363 days.

(21) Appl. No.: 14/117,959

(22) PCT Filed: May 16, 2012

(86) PCT No.: PCT/JP2012/062474
§ 371 (c)(1),
(2), (4) Date: Nov. 15, 2013

(87) PCT Pub. No.: WO2012/161042
PCT Pub. Date: Nov. 29, 2012

(65) Prior Publication Data
US 2014/0111495 A1    Apr. 24, 2014

(30) Foreign Application Priority Data

May 23, 2011    (JP) .................................. 2011-115136

(51) Int. Cl.
*H03K 3/012*    (2006.01)
*G09G 3/36*    (2006.01)
*G11C 19/28*    (2006.01)

(52) U.S. Cl.
CPC .............. *H03K 3/012* (2013.01); *G09G 3/3677* (2013.01); *G09G 3/3696* (2013.01); *G11C 19/28* (2013.01); *G09G 2310/0286* (2013.01)

(58) Field of Classification Search
CPC .............. G09G 2310/0267–2310/0291; G09G 3/3677–3/3696; H03K 3/012; G11C 19/28
See application file for complete search history.

(56) References Cited

U.S. PATENT DOCUMENTS

| 2002/0180673 A1 | 12/2002 | Tsuda et al. |
| 2003/0231735 A1* | 12/2003 | Moon et al. .................. 377/64 |

(Continued)

FOREIGN PATENT DOCUMENTS

| JP | 2001-312253 A | 11/2001 |
| JP | 2006-107692 A | 4/2006 |

(Continued)

OTHER PUBLICATIONS

Official Communication issued in International Patent Application No. PCT/JP2012/062474, mailed on Aug. 21, 2012.

*Primary Examiner* — Amare Mengistu
*Assistant Examiner* — Sarvesh J Nadkarni
(74) *Attorney, Agent, or Firm* — Keating & Bennett, LLP

(57) ABSTRACT

The purpose of this invention is to increase reliability of a switching element while reducing consumption power. In the vertical blanking period, an end pulse signal (ED) changes from the low level to the high level. The potential of first nodes (N1) in the first stage to (m−1)th stage of cascade-connected m-stage bistable circuits included in a shift register of the scanning signal drive circuit is reliably maintained at the low level, and the potential of second nodes (N2) in the first stage to the (m−1)th stage changes from the high level to the low level. In a bistable circuit in the m-th stage, the potential of the first node (N1) in the m-th stage changes from the high level to the low level, and the potential of the second node (N2) in the m-th stage is maintained at the low level. The supply to a bistable circuit of clock signals (CKA, CKB) is stopped. Until a write period in the subsequent vertical scanning period, the potential of the first node (N1) and the potential of the second node (N2) in each stage are maintained at the low level.

17 Claims, 29 Drawing Sheets

(56) References Cited

U.S. PATENT DOCUMENTS

| | | |
|---|---|---|
| 2006/0071923 A1 | 4/2006 | Lee et al. |
| 2006/0279511 A1* | 12/2006 | Uh et al. ............... 345/100 |
| 2007/0274433 A1* | 11/2007 | Tobita ................... 377/64 |
| 2008/0187089 A1* | 8/2008 | Miyayama et al. ........ 377/79 |
| 2010/0109996 A1* | 5/2010 | Park et al. .............. 345/100 |
| 2012/0032615 A1* | 2/2012 | Kikuchi et al. .......... 315/320 |

FOREIGN PATENT DOCUMENTS

| | | |
|---|---|---|
| JP | 2006-351171 A | 12/2006 |
| JP | 2009-288562 A | 12/2009 |
| WO | 2010/137197 A1 | 12/2010 |

* cited by examiner

SCANNING SIGNAL LINE DRIVE CIRCUIT, DISPLAY DEVICE HAVING THE SAME, AND DRIVING METHOD FOR SCANNING SIGNAL LINE

TECHNICAL FIELD

The present invention relates to a scanning signal line drive circuit, a display device having the same, and a driving method for a scanning signal line and, particularly, to a scanning signal line drive circuit suitable for monolithic fabrication, a display device having the same, and a driving method for a scanning signal line by the scanning signal line drive circuit.

BACKGROUND ART

Conventionally, a gate driver (a scanning signal line drive circuit) for driving gate lines (scanning signal lines) of a liquid crystal display device is often mounted as an IC (Integrated Circuit) chip in a peripheral portion of a substrate constituting a liquid crystal panel. In recent years, however, formation of a gate driver directly on a substrate is gradually increasing. Such a gate driver is called a "monolithic gate driver" or the like.

In a liquid crystal display device having a monolithic gate driver, a thin film transistor using amorphous silicon (a-Si) (hereinbelow, called a "a-Si TFT") is employed conventionally as a drive element. However, in recent years, a thin film transistor using microcrystalline silicon (μc-Si) (hereinbelow, called a "μc-Si TFT") or a thin film transistor using an oxide semiconductor (for example, IGZO) is being employed as a drive element. Hereinafter, a thin film transistor using IGZO will be called an "IGZO TFT". The μc-Si TFT or IGZO TFT has mobility higher than that of a-Si TFT. Consequently, by employing μc-Si TFT or IGZO TFT as a drive element, reduction in a picture-frame area of the liquid crystal display device and higher definition can be realized.

A display unit in an active matrix-type liquid crystal display device includes a plurality of source lines (video signal lines), a plurality of gate lines, and a plurality of pixel formation portions provided at the respective intersections of the plurality of source lines and the plurality of gate lines. The pixel formation portions are disposed in a matrix, thereby forming a pixel array. Each of the pixel formation portions includes a thin film transistor (switching element) having a gate terminal connected to a gate line passing a corresponding intersection and a source terminal connected to a source line passing the intersection, and a pixel capacitance for holding a pixel voltage value. The active matrix-type liquid crystal display device is also provided with the above-described gate driver and a source driver (video signal line drive circuit) for driving source lines.

A video signal indicative of a pixel voltage value is transmitted by a source line. However, video signals indicative of pixel voltage values of a plurality of rows cannot be transmitted by each source line at once (simultaneously). Due to this, the video signals are sequentially written (charged) row by row to the pixel capacitances in the above-described pixel formation portions disposed in a matrix. Consequently, the gate driver is configured by a shift register including a plurality of stages so that the plurality of gate lines are sequentially selected for a predetermined period. Each of the stages of the shift register is a bistable circuit that is in either one of two states (a first state and a second state) at each time point, and that outputs, as a scanning signal, a signal (hereinbelow, called a "state signal") indicating this state. By outputting active scanning signals sequentially from a plurality of bistable circuits in the shift register, the video signals are sequentially written to the pixel capacitances row by row as described above.

A bistable circuit in a conventional gate driver is configured, for example, as illustrated in FIG. 32. Such a bistable circuit is disclosed in, for example, Patent Document 1. It should be noted that transistors M3 and M7 in FIG. 32 may have a multigate configuration as disclosed in Patent Document 1. In the following, the bistable circuit illustrated in FIG. 32 will be called a "first conventional example". In the first conventional example, when a scanning signal GOUT(i–1) (set signal S) transmitted from the preceding stage becomes the high level, the transistor M3 enters an on state, so that the potential of a second node N2 becomes the low level. Consequently, transistors M5 and M6 enter an off state. Therefore, by the scanning signal GOUT(i–1) becoming the high level, the potential of the first node N1 becomes the high level, and a capacitor C1 is charged. In this state, the potential of the clock signal CK appears in the gate line. Consequently, after the scanning signal GOUT(i–1) sent from the preceding stage becomes the high level in each bistable circuit, the potential of the clock signal CK to be supplied to the bistable circuit is set to the high level, so that active scanning signals are sequentially output from a plurality of bistable circuits in the shift register. Thus, a plurality of gate lines are driven sequentially one by one. In each of the bistable circuits, in a period (a "normal operation period" which will be described later) other than a period in which an operation for outputting an active scanning signal is performed, the potential of the second node N2 is maintained at the high level so that the potential of the first node N1 is maintained at the low level.

As described above, in the normal operation period, the potential of the second node N2 has to be maintained at the high level so that the potential of the first node N1 is maintained at the low level. Consequently, in the normal operation period, a high-level potential (the potential of the second node N2) is always applied to the gate terminals of the transistors M5 and M6. Since a period in which operation for outputting an active scanning signal is performed is small in each vertical scanning period, a substantially DC potential is applied to the gate terminals of the transistors M5 and M6. As a result, the threshold shift which occurs in the transistors M5 and M6 becomes large, and it causes deterioration in the reliability of the transistors.

In relation to the present invention, Patent Document 2 discloses a gate driver including, as illustrated in FIG. 33, a plurality of bistable circuits each configured by an input unit 920, a pull-up driving unit 930, a pull-down driving unit 940, and an output unit 950. In the following, the bistable circuit illustrated in FIG. 33 will be called a "second conventional example". The input unit 920 in the second conventional example is constituted by a transistor T1, the pull-up driving unit 930 is constituted by transistors T9 and T10, the pull-down driving unit 940 is constituted by transistors T3, T4, T7, T8, and T11, and the output unit 950 is constituted by transistors T1, T5, and T6 and a capacitor C1. A second node is connected to the gate terminals of the transistors T4 and T5. The transistors T4 and T5 correspond to the above-described transistors M5 and M6, respectively. To the bistable circuit, two-phase clock signals CK1 and CK2 (duty ratio 1/4) are supplied. The clock signal CK1 is supplied to the drain terminal of the transistor T1, the gate terminal and the drain terminal of the transistor T9, and the gate terminal of the transistor T11. The clock signal CK1 is also supplied to the gate terminal of the transistor T4 and the gate terminal of the transistor T5 via the transistor T9. The clock signal CK2 is supplied to the gate terminal of the transistor T8 and the gate terminal and the drain terminal of the transistor T10. The clock signal CK2 is also supplied to the gate terminal of the transistor T6 via the transistor T10.

In the second conventional example, in a manner similar to the first conventional example, the potential of the second node N2 becomes the low level in the period in which the operation for outputting an active scanning signal is performed. On the other hand, in the normal operation period, the potential of the second node N2 becomes the high level when the clock signal CK1 becomes the high level, and becomes the low level when the clock signal CK2 becomes the high level. Therefore, potential whose duty ratio is substantially 1/2 is supplied to the gate terminals of the transistors T4 and T5 to which the second node N2 is connected. As a result, the threshold shift which occurs in the transistors T4 and T5 can be suppressed, so that the reliability of the transistors can be increased.

PRIOR ART DOCUMENTS

Patent Documents

[Patent Document 1] Japanese Patent Application Laid-Open No. 2006-107692
[Patent Document 2] Japanese Patent Application Laid-Open No. 2006-351171

SUMMARY OF THE INVENTION

Problems to be Solved by the Invention

However, in the second conventional example, the number of transistors to which clock signals are supplied becomes large, so that the power consumption increases.

An object of the present invention is, therefore, to provide a scanning signal line drive circuit with increased reliability of a switching element while reducing power consumption, a display device having the same, and a driving method for a scanning signal line.

Means for Solving the Problems

A first aspect of the present invention is directed to a scanning signal line drive circuit driving a plurality of scanning signal lines,
the scanning signal line drive circuit comprising:
a shift register including a plurality of bistable circuits which are cascade-connected to one another and sequentially making output signals of the plurality of bistable circuits active based on a clock signal which is supplied from the outside and periodically repeats an on level and an off level, wherein
each of the bistable circuits comprises:
a first driving unit connected to a first node and changing potential of the first node based on a signal received;
a second driving unit connected to a second node and changing potential of the second node based on a signal received; and
an output unit connected to the first node and the second node and, when the potential of the first node is at the on level, the potential of the second node is at the off level, and the potential of the signal received by the first driving unit is at the off level, outputting the output signal which is active based on the clock signal,
the first driving unit has a first-node-turn-off switching element having a control terminal connected to the second node, a conduction terminal connected to the first node, and another conduction terminal to which off-level potential is supplied,
the output unit has an output-node-turn-off switching element having a control terminal connected to the second node, a conduction terminal connected to an output node for outputting the output signal, and another conduction terminal to which off-level potential is supplied, and
the first driving unit and the second driving unit maintain the potential of the first node and the potential of the second node at off level, respectively, in a predetermined period of two horizontal scanning periods or longer in each vertical scanning period.

According to a second aspect of the present invention, in the first aspect of the present invention,
supply of the clock signal to the plurality of bistable circuits stops in the predetermined period.

According to a third aspect of the present invention, in the second aspect of the present invention,
the longer the predetermined period is, the higher the frequency of the clock signal is.

According to a fourth aspect of the present invention, in the second aspect of the present invention,
the first driving unit and the second driving unit further maintain the potential of the first node and the potential of the second node at the off level, respectively, during a period from power-on until start of a first vertical scanning period, and
supply of the clock signal to the plurality of bistable circuits further stops during a period from power-on until start of the first vertical scanning period.

According to a fifth aspect of the present invention, in the second aspect of the present invention,
the scanning signal line drive circuit further comprises a clock control circuit which stops supply of the clock signal to the plurality of bistable circuits in the predetermined period based on an end signal whose potential becomes an on level to make the output signal of a bistable circuit in a final stage in the shift register inactive after the output signal becomes active.

According to a sixth aspect of the present invention, in the second aspect of the present invention,
the first driving unit in the bistable circuit in the final stage further comprises a first end switching element having a control terminal to which the end signal is supplied, a conduction terminal connected to the first node, and another conduction terminal to which off-level potential is supplied, and
the second driving unit in each bistable circuit comprises a second end switching element having a control terminal to which the end signal is supplied, a conduction terminal connected to the second node, and another conduction terminal to which off-level potential is supplied.

According to a seventh aspect of the present invention, in the sixth aspect of the present invention,
the first driving unit in the bistable circuit in each of the stages other than the final stage further comprises the first end switching element.

According to an eighth aspect of the present invention, in the sixth aspect of the present invention,
the second driving unit in the bistable circuit in each of the stages other than the front stage further comprises a start switching element which changes the potential of the second node toward the on level based on a start signal which becomes the on level at a start timing of each vertical scanning period.

According to a ninth aspect of the present invention, in the eighth aspect of the present invention, the first driving unit further comprises a first-node-turn-on switching element which changes the potential of the first node toward the on level based on a set signal, the set signal in the bistable circuit in the front stage is the start signal, and the set signal in a bistable circuit other than the front stage is an output signal of a pre-stage bistable circuit of the bistable circuit.

According to a tenth aspect of the present invention, in the ninth aspect of the present invention, the output unit further comprises:

an output control switching element having a control terminal connected to the first node, a conduction terminal to which the clock signal is supplied, and another conduction terminal connected to the output node; and a capacitive element having an end to which the control terminal of the output control switching element is connected and another end connected to the output node.

According to an eleventh aspect of the present invention, in the tenth aspect of the present invention, the second driving unit further comprises a second-node-turn-off switching element having a conduction terminal connected to the second node and another conduction terminal to which off-level potential is supplied.

According to a twelfth aspect of the present invention, in the eleventh aspect of the present invention, the second driving unit is provided with, as the second-node-turn-off switching element, a first second-node-turn-off switching element having a control terminal to which the set signal is supplied, a conduction terminal connected to the second node, and another conduction terminal to which off-level potential is supplied, and a second second-node-turn-off switching element having a control terminal connected to the output node, a conduction terminal connected to the second node, and another conduction terminal to which off-level potential is supplied.

According to a thirteenth aspect of the present invention, in the eleventh aspect of the present invention, the control terminal of the second-node-turn-off switching element is connected to the first node.

According to a fourteenth aspect of the present invention, in the eleventh aspect of the present invention, the second driving unit in a bistable circuit in each of the stages other than the front stage further comprises a second-node-turn-on switching element which changes the potential of the second node toward the on level based on an output signal of a post-stage bistable circuit of the bistable circuit.

According to a fifteenth aspect of the present invention, in the eleventh aspect of the present invention, the clock signal comprises a first clock signal and a second clock signal whose phases are deviated from each other only by one horizontal scanning period, the first clock signal is supplied to one conduction terminal of the output control switching element, and the second driving unit further comprises a charge replenishment switching element which changes the potential of the second node toward the on level based on the second clock signal.

A sixteenth aspect of the present invention is directed to a display device comprising:

a display unit in which a plurality of scanning signal lines are disposed;

a scanning signal line drive circuit for driving the plurality of scanning signal lines; and a display control circuit supplying a clock signal which periodically repeats an on level and an off level, to the scanning signal line drive circuit, wherein the scanning signal line drive circuit includes a shift register having a plurality of bistable circuits which are cascade-connected to one another and sequentially making output signals of the plurality of bistable circuits active based on the clock signal, each of the bistable circuits comprises:

a first driving unit connected to a first node and changing potential of the first node based on a signal received;

a second driving unit connected to a second node and changing potential of the second node based on a signal received; and an output unit connected to the first node and the second node and, when the potential of the first node is at the on level, the potential of the second node is at the off level, and the potential of the signal received by the first driving unit is at the off level, outputting the output signal which is active based on the clock signal, the first driving unit has a first-node-turn-off switching element having a control terminal connected to the second node, a conduction terminal connected to the first node, and another conduction terminal to which off-level potential is supplied, the output unit has an output-node-turn-off switching element having a control terminal connected to the second node, a conduction terminal connected to an output node for outputting the output signal, and another conduction terminal to which off-level potential is supplied, and the first driving unit and the second driving unit maintain the potential of the first node and the potential of the second node at off level, respectively, in a predetermined period of two horizontal scanning periods or more in each vertical scanning period.

According to a seventeenth aspect of the present invention, in the sixteenth aspect of the present invention, supply of the clock signal to the plurality of bistable circuits stops in the predetermined period.

According to an eighteenth aspect of the present invention, in the seventeenth aspect of the present invention, the scanning signal line drive circuit further comprises a clock control circuit which stops supply of the clock signal to the plurality of bistable circuits in the predetermined period based on an end signal whose potential becomes on level to make the output signal of a bistable circuit in a final stage in the shift register inactive after the output signal becomes active.

According to a nineteenth aspect of the present invention, in the seventeenth aspect of the present invention, the display control circuit stops supply of the clock signal to the plurality of bistable circuits in the predetermined period.

According to a twentieth aspect of the present invention, in the seventeenth aspect of the present invention, the display control circuit makes the frequency of the clock signal higher as the predetermined period becomes longer.

According to a twenty-first aspect of the present invention, in any one of the sixteenth to twentieth aspect of the present invention, the display unit and the scanning signal line drive circuit are integrally formed.

A twenty-second aspect of the present invention is directed to a driving method for a plurality of scanning signal lines by a scanning signal line drive circuit comprising a shift register including a plurality of bistable circuits which are cascade-connected to one another and sequentially making output signals of the plurality of bistable circuits active based on a clock signal which is supplied from the outside and periodically repeats an on level and an off level, the driving method comprising the steps of:

receiving a signal by each of the bistable circuits and, based on the signal, changing the potential of a first node in the bistable circuit;

receiving a signal in each of the bistable circuits and, based on the signal, changing the potential of a second node in the bistable circuit; and outputting the output signal which is active when the potential of the first node is at the on level, the potential of the second node is at the off level, and the potential of a signal received by each bistable circuit in the step of changing the potential of the first node is at the off level, wherein each bistable circuit comprises:

a first-node-turn-off switching element having a control terminal connected to the second node, a conduction terminal connected to the first node, and another conduction terminal to which off-level potential is supplied; and an output-node-turn-off switching element having a control terminal connected to the second node, a conduction terminal connected to an output node for outputting the output signal, and another conduction terminal to which off-level potential is supplied, in the step of changing the potential of the first node, the potential of the first node is maintained at off level in a predetermined period of more than two horizontal scanning periods in each vertical scanning period, and in the step of changing the potential of the second node, the potential of the second node is maintained at the off level in the predetermined period.

According to a twenty-third aspect of the present invention, in the twenty-second aspect of the present invention, the driving method further comprises a step of stopping supply of the clock signal to the plurality of bistable circuits in the predetermined period.

According to a twenty-fourth aspect of the present invention, in the twenty-third aspect of the present invention, the longer the predetermined period is, the higher the frequency of the clock signal is.

According to a twenty-fifth aspect of the present invention, in the twenty-third aspect of the present invention, in the step of changing the potential of the first node, the potential of the first node is maintained at the off level during a period from power on until start of a first vertical scanning period, in the step of changing the potential of the second node, the potential of the second node is maintained at the off level during a period from power-on until start of a first vertical scanning period, and in the step of stopping supply of the clock signal, supply of the clock signal is stopped during a period from power-on until start of a first vertical scanning period.

Effects of the Invention

According to the first aspect of the present invention, in a predetermined period of two horizontal scanning periods or longer in each vertical scanning period, the potential of the second node in each bistable circuit becomes the off level. Consequently, the duty ratio of the potential applied to the control terminal of the first-node-turn-off switching element and the control terminal of the output-node-turn-off switching element is substantially reduced more than that in the conventional technique. Consequently, the threshold shift in the first-node-turn-off switching element and the output-node-turn-off switching element is suppressed. By increasing the reliability of the first-node-turn-off switching element and the output-node-turn-off switching element, the size of the first-node-turn-off switching element and the output-node-turn-off switching element can be reduced. By reducing the size of the first-node-turn-off switching element and the output-node-turn-off switching element, power consumption can be reduced. Consequently, while reducing power consumption, the reliability of the first-node-turn-off switching element and the output-node-turn-off switching element can be increased. Further, by reducing the size of the first-node-turn-off switching element and the output-node-turn-off switching element, the size of the scanning signal line drive circuit can be reduced.

According to the second aspect of the present invention, in the predetermined period, supply of a clock signal to a bistable circuit is stopped. Therefore, in the predetermined period, the potential of the first node and the potential of the second node are reliably maintained at the low level. Accordingly, the potential of the second node in each bistable circuit is reliably maintained at the off level. Therefore, the duty ratio of the potential of the second node in each bistable circuit is reliably decreased from that in the conventional technique. As a result, by reliably suppressing the threshold shift in the first-node-turn-off switching element and the output-node-turn-off switching element, the reliability of the elements can be reliably increased.

According to the third aspect of the present invention, the longer the predetermined period is, the higher the frequency of the clock signal is. Consequently, the length of one vertical scanning period is constant. Therefore, without decreasing a substantive drive frequency, the reliability of the first-node-turn-off switching element and the output-node-turn-off switching element can be increased.

According to the fourth aspect of the present invention, after power-on, the potential of the first node and the potential of the second node are reset to the off level. Further, in a period after power-on until the start time point of a first vertical scanning period, supply of a clock signal to a bistable circuit is stopped. Consequently, the potential of the first node and the potential of the second node are reliably maintained at the off level. Therefore, the circuit operation can be made more stable.

According to the fifth aspect of the present invention, the clock control circuit controls supply of a clock signal to a bistable circuit based on the end signal. Consequently, supply of the clock signal is controlled reliably. Thus, the circuit operation can be stabilized.

According to the sixth aspect of the present invention, based on the end signal, at the start time of the vertical blanking period, the potential of the second node in each bistable circuit is reliably set to the off level, and the potential of the first node in the bistable circuit in at least the final stage is reliably set to the off level. Consequently, the duty ratio of the potential supplied to the control terminal of the first-node-turn-off switching element and the control terminal of the output-node-turn-off switching element is reliably made lower than that in the conventional technique, and the circuit operation can be further stabilized.

According to the seventh aspect of the present invention, based on the end signal, at the start time of the vertical blanking period, the potential of the first node in each bistable circuit is reliably set to the off level. Consequently, the duty ratio of the potential supplied to the control terminal of the first-node-turn-off switching element and the control terminal of the output-node-turn-off switching element is reliably made lower than that in the conventional technique, and the circuit operation can be further stabilized.

According to the eighth aspect of the present invention, at the start time of the vertical scanning period, by a start signal, the potential of the second node in bistable circuits in a stage other than the front stage is reliably set to the on level. Consequently, the circuit operation can be further stabilized.

According to the ninth aspect of the present invention, based on a set signal, the potential of the first node is reliably set to the on level. Consequently, the circuit operation can be further stabilized.

According to the tenth aspect of the present invention, based on the potential of the first node and the potential of the second node, the output signal based on the clock signal is reliably output. Consequently, the circuit operation can be further stabilized.

According to the eleventh aspect of the present invention, the potential of the second node can be reliably maintained at the on level or the off level. Consequently, the circuit operation can be further stabilized.

According to the twelfth aspect or the thirteenth aspect of the present invention, the potential of the second node can be reliably maintained at the off level. Consequently, the circuit operation can be further stabilized.

According to the fourteenth aspect of the present invention, the potential of the second node can be reliably set to the on level based on the reset signal. Consequently, the circuit operation can be further stabilized.

According to the fifteenth aspect of the present invention, the potential of the second node rises in the period in which the second clock signal is at the on level out of the period other than the period in which the operation for outputting an active output signal is performed. Consequently, in the period other than the period in which the operation for outputting an active output signal is performed, the potential of the second node can be reliably maintained at the high level. Thus, the circuit operation can be further stabilized.

According to the sixteenth aspect, the seventeenth aspect, and the twentieth aspect of the present invention, in the display device, effects similar to those of the first aspect, the second aspect, and the third aspect of the present invention can be produced, respectively.

According to the eighteenth aspect of the present invention, supply of a clock signal can be reliably stopped on the side of the scanning signal line drive circuit.

According to the nineteenth aspect of the present invention, supply of a clock signal can be reliably stopped on the side of the display control circuit.

According to the twenty-first aspect of the present invention, a picture-frame area of a display device can be reduced.

According to the twenty-second to twenty-fifth aspects of the present invention, in a driving method for a scanning signal line, effects similar to the first to fourth aspects of the present invention can be produced, respectively.

MODES FOR CARRYING OUT THE INVENTION

Hereinafter, with reference to the appended drawings, embodiments of the present invention will be described. It should be noted that, in the following description, a gate terminal of a thin film transistor corresponds to a control terminal, a drain terminal corresponds to one conduction terminal, and a source terminal corresponds to another conduction terminal. In the description, it is assumed that all of thin film transistors provided in a bistable circuit are of the n-channel type.

1. First Embodiment

1.1 General Configuration and Operation

Figure 1:
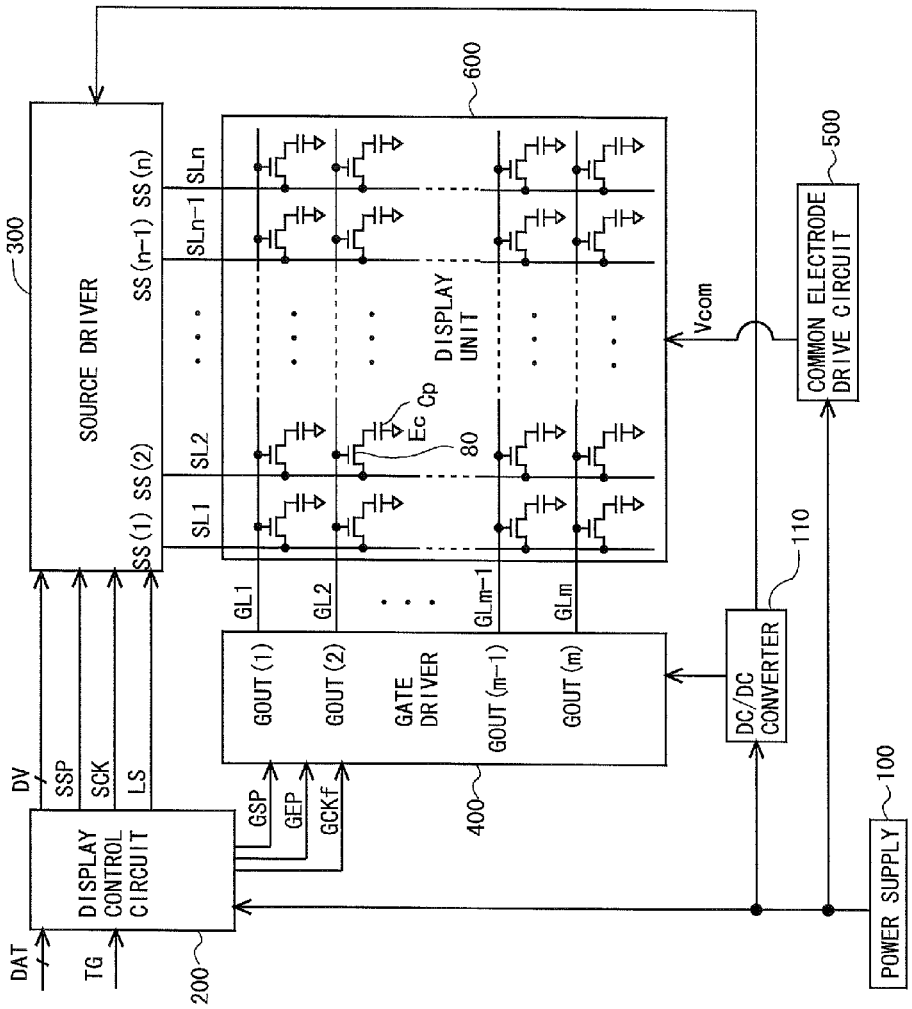
FIG. 1 is a block diagram illustrating a general configuration of a liquid crystal display device according to a first embodiment of the present invention.

FIG. 1 is a block diagram illustrating a general configuration of an active matrix-type liquid crystal display device according to a first embodiment of the present invention. As illustrated in FIG. 1, the liquid crystal display device includes a power supply 100, a DC/DC converter 110, a display control circuit 200, a source driver (video signal line drive circuit) 300, a gate driver (scanning signal line drive circuit) 400, a common electrode drive circuit 500, and a display unit 600. It should be noted that the gate driver 400 is formed on a display panel including the display unit 600 by using amorphous silicon, polycrystal silicon, microcrystal silicon, oxide semiconductor (for example, IGZO), or the like. That is, in the present embodiment, the gate driver 400 and the display unit 600 are formed on the same substrate (array substrate as one of two substrates constituting the liquid crystal panel). Consequently, the picture-frame area of the liquid crystal display device can be reduced.

In the display unit 600, a pixel circuit is formed, which includes n source lines (video signal lines) SL1 to SLn, m gate lines (scanning signal lines) GL1 to GLm, and m×n pixel formation portions provided at the respective intersections of the source lines SL1 to SLn and the gate lines. The plurality of pixel formation portions are disposed in a matrix, thereby forming a pixel array. Each of the pixel formation portions is constituted by a thin film transistor 80 as a switching element having a gate terminal connected to a gate line passing a corresponding intersection and a source terminal connected to a source line passing the intersection, a pixel electrode connected to a drain terminal of the thin film transistor 80, a common electrode Ec as an opposed electrode provided commonly for the plurality of pixel formation portions, and a liquid crystal layer commonly provided for the plurality of pixel formation portions and sandwiched between the pixel electrode and the common electrode Ec. By a liquid crystal capacitance formed by the pixel electrode and the common electrode Ec, a pixel capacitance Cp is configured. It should be noted that, although an auxiliary capacitance is usually provided in parallel to the liquid crystal capacitance to reliably hold the voltage in the pixel capacitance Cp, since the auxiliary capacitance is not directly related to the present invention, its description and illustration will not be given.

The power supply 100 supplies predetermined power supply voltage to the DC/DC converter 110, the display control circuit 200, and the common electrode drive circuit 500. The DC/DC converter 110 generates predetermined DC voltage for operating the source driver 300 and the gate driver 400 from the power supply voltage and supplies the generated predetermined DC voltage to the source driver 300 and the gate driver 400. The common electrode drive circuit 500 supplies predetermined potential Vcom to the common electrode Ec.

The display control circuit 200 receives an image signal DAT and a timing signal group TG such as a horizontal synchronization signal, a vertical synchronization signal, and the like which are sent from the outside, and outputs a digital video signal DV, and a source start pulse signal SSP, a source clock signal SCK, a latch strobe signal LS, a gate start pulse signal GSP, a gate end pulse signal GEP, and a gate clock signal GCKf (hereinbelow, called a "pre-control gate clock signal") for controlling an image display in the display unit 600. It should be noted that, in the present embodiment, the pre-control gate clock signal GCKf comprises a clock signal GCKf1 (hereinbelow, called a "first pre-control gate clock signal") and a clock signal GCKf2 (hereinbelow, called a "second pre-control gate clock signal") which are two-phase clock signals. The potential on the high level side of the pre-control gate clock signal GCKf is Vdd, and the potential on the low level side is Vss.

The source driver 300 receives the digital video signal DV, the source start pulse signal SSP, the source clock signal SCK, and the latch strobe signal LS which are output from the display control circuit 200 and applies video signals SS(1) to SS(n) to the source lines SL1 to SLn, respectively.

The gate driver 400 repeats application of active scanning signals GOUT(1) to GOUT(m) to the gate lines GL1 to GLm, respectively, using one vertical scanning period as a cycle, on the basis of the gate start pulse signal GSP, the gate end pulse signal GEP, and the pre-control gate clock signal GCKf which are output from the display control circuit 200. It should be noted that detailed description of the gate driver 400 will be given later.

As described above, the video signals SS(1) to SS(n) are applied to the source lines SL1 to SLn, respectively, and the scanning signals GOUT(1) to GOUT(m) are applied to the gate lines GL1 to GLm, respectively, so that an image based on the image signal DAT which is sent from the outside is displayed on the display unit 600.

1.2 Configuration and Operation of Gate Driver

Figure 2:
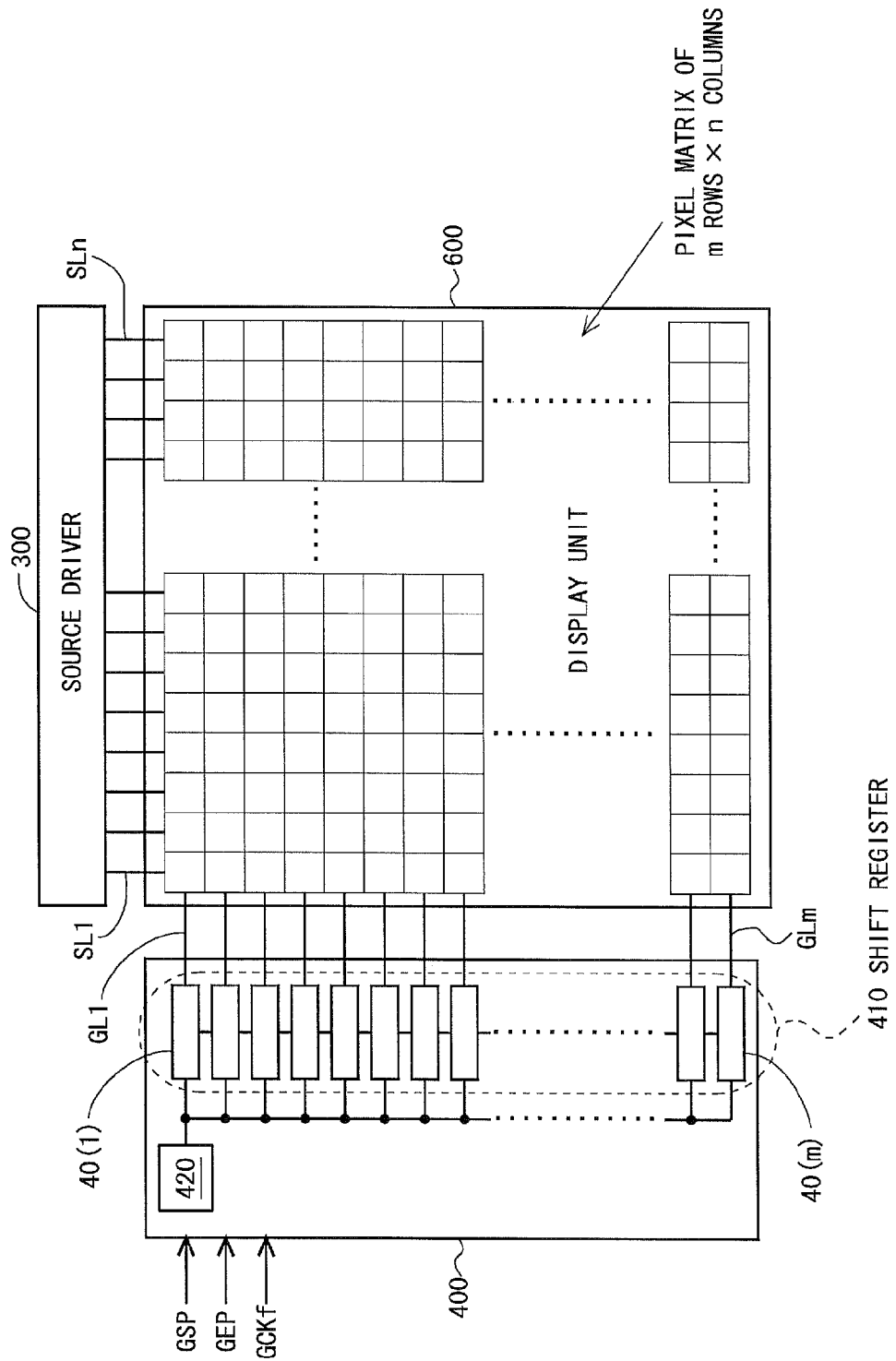
FIG. 2 is a block diagram for explaining a configuration of a gate driver in the first embodiment.

FIG. 2 is a block diagram for explaining the configuration of the gate driver 400 in the present embodiment. As illustrated in FIG. 2, the gate driver 400 is configured by a shift register 410 including m (stages) of bistable circuits 40(1) to 40(m) and a clock control circuit 420. The clock control circuit 420 receives the gate start pulse signal GSP, the gate end pulse signal GEP, and the pre-control gate clock signal GCKf and supplies a gate clock signal GCK (hereinbelow, called a "post-control gate clock signal"), as a signal obtained by stopping the pre-control gate clock signal GCKf for a part of a period, to the shift register 410. It should be noted that the clock control circuit 420 will be described specifically later.

In the display unit 600, the pixel matrix of m rows×n columns is formed as described above, and the bistable circuits are provided in the stages so as to correspond to the rows in the pixel matrix in a one-to-one corresponding manner. The bistable circuit is in either one of two states (a first state and a second state) at each time point and outputs a signal (hereinbelow, called a "state signal") indicating this state. In the present embodiment, a high-level (on-level) state signal is output from the bistable circuit when the bistable circuit is in the first state, and a low-level (off-level) state signal is output from the bistable circuit when the bistable circuit is in the second state. In the following, a period in which the high-level state signal is output from a bistable circuit and a high-level scanning signal is applied to a gate line corresponding to the bistable circuit will be called a "selection period".

Figure 3:
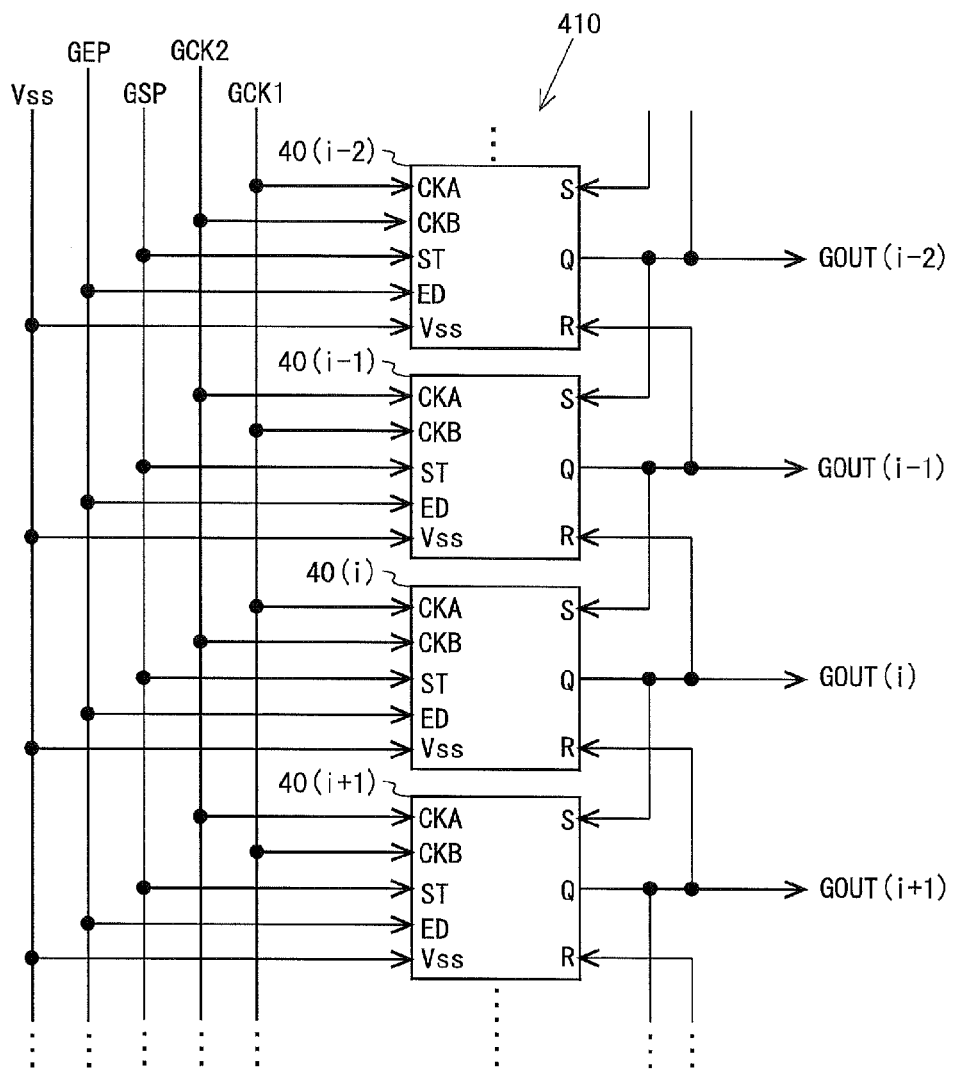
FIG. 3 is a block diagram illustrating a configuration of a shift register in the first embodiment.
Figure 4:
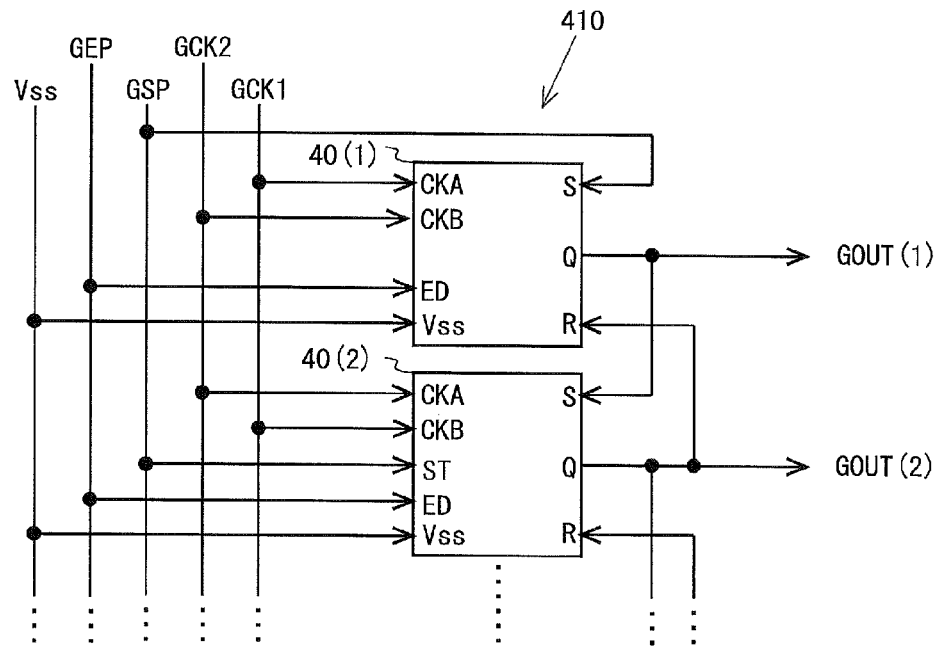
FIG. 4 is a block diagram illustrating a configuration of a front stage side of the shift register in the first embodiment.
Figure 5:
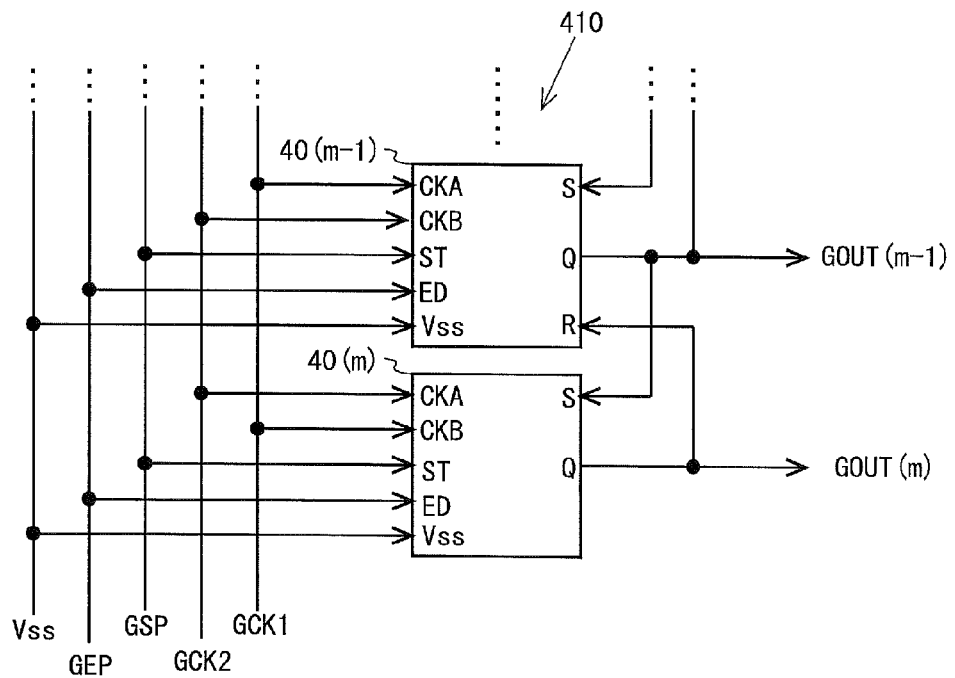
FIG. 5 is a block diagram illustrating a configuration of a final stage side of the shift register in the first embodiment.

FIG. 3 is a block diagram illustrating the configuration except for the front and final stages, of the shift register 410 in the present embodiment. FIG. 4 is a block diagram illustrating the configuration of a front stage side of the shift register 410 in the present embodiment. FIG. 5 is a block diagram illustrating the configuration of a final stage side of the shift register 410 in the present embodiment. It should be noted that, in the following description, there is a case that a bistable circuit of the x-th stage (x=1 to m) will be simply called an "x-th stage"). As described above, the shift register 410 is configured by the m bistable circuits 40(1) to 40(m). FIG. 3 illustrates the (i−2)th stage 40(i−2) to the (i+1)th stage 40(i+1), FIG. 4 illustrates the first stage 40(1) and the second stage 40(2), and FIG. 5 illustrates the (m−1)th stage 40(m−1) and the m-th stage 40(m).

As illustrated in FIGS. 3 to 5, each bistable circuit is provided with an input terminal for receiving a clock signal CKA, an input terminal for receiving a clock signal CKB, an input terminal for receiving the low-level DC power supply potential Vss (the magnitude of the potential will be also called a "Vss potential"), an input terminal for receiving the set signal S, an input terminal for receiving an end signal ED, and an output terminal for outputting a state signal Q. It should be noted that, in the following, paying attention to the functions of signals, the clock signal CKA will be called an "operation control clock signal", and the clock signal CKB will be called a "charge replenishment clock signal". In each of the stages except for the m-th stage (final stage), an input terminal for receiving a reset signal R is also provided. In each of the stages except for the first stage (front stage), an input terminal for receiving a start signal ST is also provided.

Figure 6:
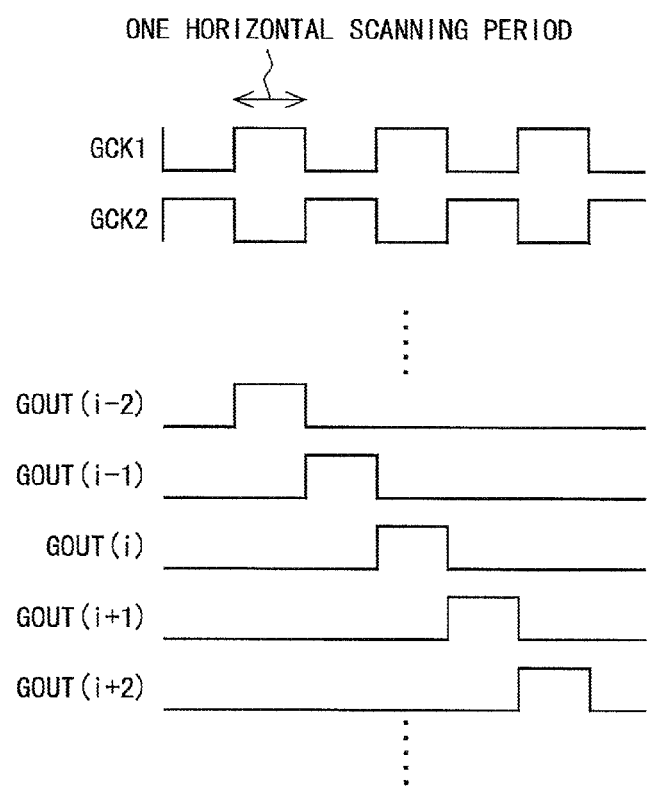
FIG. 6 is a signal waveform diagram for explaining the operation of the gate driver in the first embodiment.

To the shift register 410, as the post-control gate clock signal GCK, a clock signal GCK1 (hereinbelow, called a "first post-control gate clock signal") and a clock signal GCK2 (hereinbelow, called a "second post-control gate clock signal") which are two-phase clock signals are supplied. As illustrated in FIG. 6, the phases of the first post-control gate clock signal GCK1 and the second post-control gate clock signal GCK2 are deviated from each other only by one horizontal scanning period, and both of the signals enter the high-level (Vdd level) state only for one horizontal scanning period in two horizontal scanning periods (except for a vertical blanking period which will be described later).

Signals supplied to the input terminals in each stage (each bistable circuit) in the shift register 410 areas follows. It is assumed that i and m are even numbers. As illustrated in FIGS. 3 to 5, to odd-numbered stages, the first post-control gate clock signal GCK1 is supplied as the operation control clock signal CKA, and the second post-control gate clock signal GCK2 is supplied as the charge replenishment clock signal CKB. To even-numbered stages, the first post-control gate clock signal GCK1 is supplied as the charge replenishment clock signal CKB, and the second post-control gate clock signal GCK2 is supplied as the operation control clock signal CKA. To both of the odd-numbered stages and the even-numbered stages, the state signal Q output from the preceding stage is supplied as the set signal S, and the state signal Q output from the next stage is supplied as the reset signal R. However, to the first stage (front stage) 40(1), the gate start pulse signal GSP is supplied as the set signal S. To the m-th stage (final stage) 40(m), the reset signal R is not supplied. To the every stages, the gate end pulse signal GEP is commonly supplied as the end signal ED and the low-level DC power supply potential is commonly supplied. To the stages except for the first stage 40(1), the gate start pulse signal GSP is supplied as a start signal.

In such a configuration, when the gate start pulse signal GSP as the set signal S is supplied to the first stage 40(1) of the shift register 410, a pulse included in the gate start pulse signal GSP (this pulse is included in the state signal Q which is output from each stage) is sequentially transferred from the first stage 40(1) to the m-th stage 40(m) based on the first post-control gate clock signal GCK1 and the second post-control gate clock signal GCK2. According to the transfer of the pulse, the state signals Q output from the first stage 40(1) to the m-th stage 40(m) sequentially become the high level. The state signals Q output from the first stage 40(1) to the m-th stage 40(m) are supplied as scanning signals GOUT(1) to GOUT(m) to the gate lines GL1 to GLm, respectively. It should be noted that the state signals Q output from the first stage 40(1) to the m-th stage 40(m) may be supplied as the scanning signals GOUT(1) to GOUT(m) to the gate lines GL1 to GLm, respectively, after the voltages of the state signals are increased by a level shifter. By the above, as illustrated in FIG. 6, scanning signals which become the high level (active) sequentially by one horizontal scanning period are supplied to the gate lines in the display unit 600. It should be noted that the detailed operation of the gate driver 400 will be described later.

1.3 Configuration of Bistable Circuit

Figure 7:
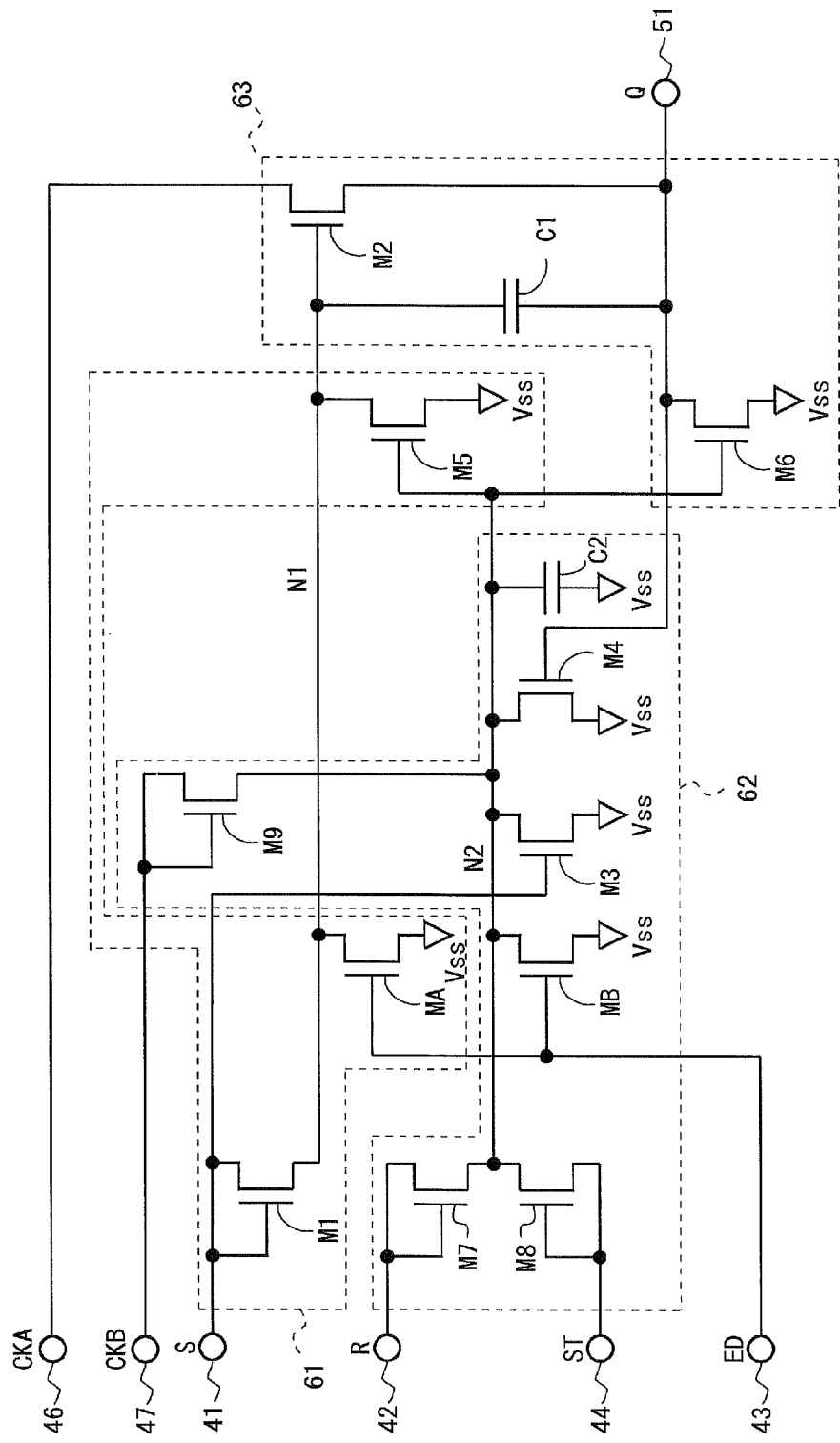
FIG. 7 is a circuit diagram illustrating a configuration of a bistable circuit in a stage other than the front and final stages in the first embodiment.

FIG. 7 is a circuit diagram illustrating the configuration of each of the bistable circuits except for the first stage (front stage) and the m-th stage (final stage) in the present embodiment. As illustrated in FIG. 7, the bistable circuit is configured by a first driving unit 61, a second driving unit 62, and an output unit 63. The bistable circuit is also provided with six input terminals 41 to 44, 46, and 47, and one output terminal (output node) 51, in addition to an input terminal for the low-level DC power supply potential Vss. Reference numeral 41 is designated to the input terminal for receiving the set signal S, reference numeral 42 is designated to the input terminal for receiving the reset signal R, reference numeral 43 is designated to the input terminal for receiving the end signal ED, reference numeral 44 is designated to the input terminal for receiving the start signal ST, reference numeral 46 is designated to the input terminal for receiving the operation control clock signal CKA, and reference numeral 47 is designated to the input terminal for receiving the charge replenishment clock signal CKB. Reference numeral 51 is designated to the output terminal for outputting the state signal Q.

The first driving unit 61 is configured by three thin film transistors M1, M5, and MA. The second driving unit 62 is configured by six thin film transistors M3, M4, M7 to M9, and MB, and one capacitor C2. The output unit 63 is configured by two thin film transistors M2 and M6 and one capacitor C1.

Next, the connection relations among components in the bistable circuit will be described. The source terminal of the thin film transistor M1, the gate terminal of the thin film transistor M2, the drain terminal of the thin film transistor M5, and one end of the capacitor C1 are connected to one another. It should be noted that, for convenience, the connection point (wire) to which they are connected to one another will be called a "first node". The drain terminal of the thin film transistor M3, the drain terminal of the thin film transistor M4, the gate terminal of the thin film transistor M5, the gate terminal of the thin film transistor M6, the source terminal of the thin film transistor M7, the source terminal of the thin film transistor M8, the source terminal of the thin film transistor M9, the drain terminal of the thin film transistor MB, and one end of the capacitor C2 are connected to one another. It should be noted that, for convenience, the connection point (wire) to which they are connected to one another will be called a "second node". Reference numeral N1 is designated to the first node, and reference numeral N2 is designated to the second node. As described above, the source terminal of the thin film transistor M1, the drain terminal of the thin film transistor M5, and the drain terminal of the thin film transistor MA which are provided in the first driving unit 61 are connected to the first node N1. The drain terminal of the thin film transistor M3, the drain terminal of the thin film transistor M4, the source terminal of the thin film transistor M7, the source terminal of the thin film transistor M8, the source terminal of the thin film transistor M9, the drain terminal of the thin film transistor MB, and one end of the capacitor C2 which are provided in the second driving unit 62 are connected to the second node N2. Further, the gate terminal of the thin film transistor M2 and one end of the capacitor C1 provided in the output unit 63 are connected to the first node N1, and the gate terminal of the thin film transistor M6 is connected to the second node N2.

With respect to the thin film transistor M1, the gate terminal and the drain terminal are connected to the input terminal 41 (that is, diode-connected) and the source terminal is connected to the first node N1. With respect to the thin film transistor M2, the gate terminal is connected to the first node N1, the drain terminal is connected to the input terminal 46, and the source terminal is connected to the output terminal 51. With respect to the thin film transistor M3, the gate terminal is connected to the input terminal 41, the drain terminal is connected to the second node N2, and the source terminal is connected to the input terminal for the DC power supply potential Vss. With respect to the thin film transistor M4, the gate terminal is connected to the output terminal 51, the drain terminal is connected to the second node N2, and the source terminal is connected to the input terminal for the DC power supply potential Vss. With respect to the thin film transistor M5, the gate terminal is connected to the second node N2, the drain terminal is connected to the first node N1, and the source terminal is connected to the input terminal for the DC power supply potential Vss. With respect to the thin film transistor M6, the gate terminal is connected to the second node N2, the drain terminal is connected to the output terminal 51, and the source terminal is connected to the input terminal for the DC power supply potential Vss. With respect to the thin film transistor M7, the gate terminal and the drain terminal are connected to the input terminal 42 (that is, diode-connected), and the source terminal is connected to the second node N2. With respect to the thin film transistor M8, the gate terminal and the drain terminal are connected to the input terminal 44 (that is, diode-connected), and the source terminal is connected to the second node N2. With respect to the thin film transistor M9, the gate terminal and the drain terminal are connected to the input terminal 47 (that is, diode-connected), and the source terminal is connected to the second node N2. With respect to the thin film transistor MA, the gate terminal is connected to the input terminal 43, the drain terminal is connected to the first node N1, and the source terminal is connected to the input terminal for the DC power supply potential Vss. With respect to the thin film transistor MB, the gate terminal is connected to the input terminal 43, the drain terminal is connected to the second node N2, and the source terminal is connected to the input terminal for the DC power supply potential Vss. With respect to the capacitor C1, one end is connected to the first node, and the other end is connected to the output terminal 51. With respect to the capacitor C2, one end is connected to the second node N2, and the other end is connected to the input terminal for the DC power supply potential Vss.

Next, the function of each of the components in the bistable circuit will be described. The thin film transistor M1 changes the potential of the first node N1 toward the high level when the potential of the set signal S is at the high level. The thin film transistor M2 supplies the potential of the operation control clock signal CKA to the output terminal 51 when the potential of the first node N1 is at the high level. The thin film transistor M3 changes the potential of the second node N2 toward the Vss potential when the potential of the set signal S is at the high level. The thin film transistor M4 changes the potential of the second node N2 toward the Vss potential when the potential of the state signal Q (the potential of the output terminal 51) is at the high level. The thin film transistor M5 changes the potential of the first node N1 toward the Vss potential when the potential of the second node N2 is at the high level. The thin film transistor M6 changes the potential of the output terminal 51 toward the Vss potential when the potential of the second node N2 is at the high level. The thin film transistor M7 changes the potential of the second node N2 toward the high level when the potential of the reset signal R is at the high level. The thin film transistor M8 changes the potential of the second node N2 toward the high level when the potential of the start signal ST is at the high level. The thin film transistor M9 changes the potential of the second node N2 toward the high level when the potential of the charge replenishment clock signal CKB is at the high level. The thin film transistor MA changes the potential of the first node N1 toward the Vss potential when the end signal ED is at the high level. The thin film transistor MB changes the potential of the second node N2 toward the Vss potential when the end signal ED is at the high level. The capacitor C1 functions as a compensation capacitor for maintaining the potential of the first node at the high level during a period in which the gate line connected to the bistable circuit is in a selection state. The capacitor C2 functions as a compensation capacitor for maintaining the potential of the second node N2 at the high level during the normal operation period.

Figure 8:
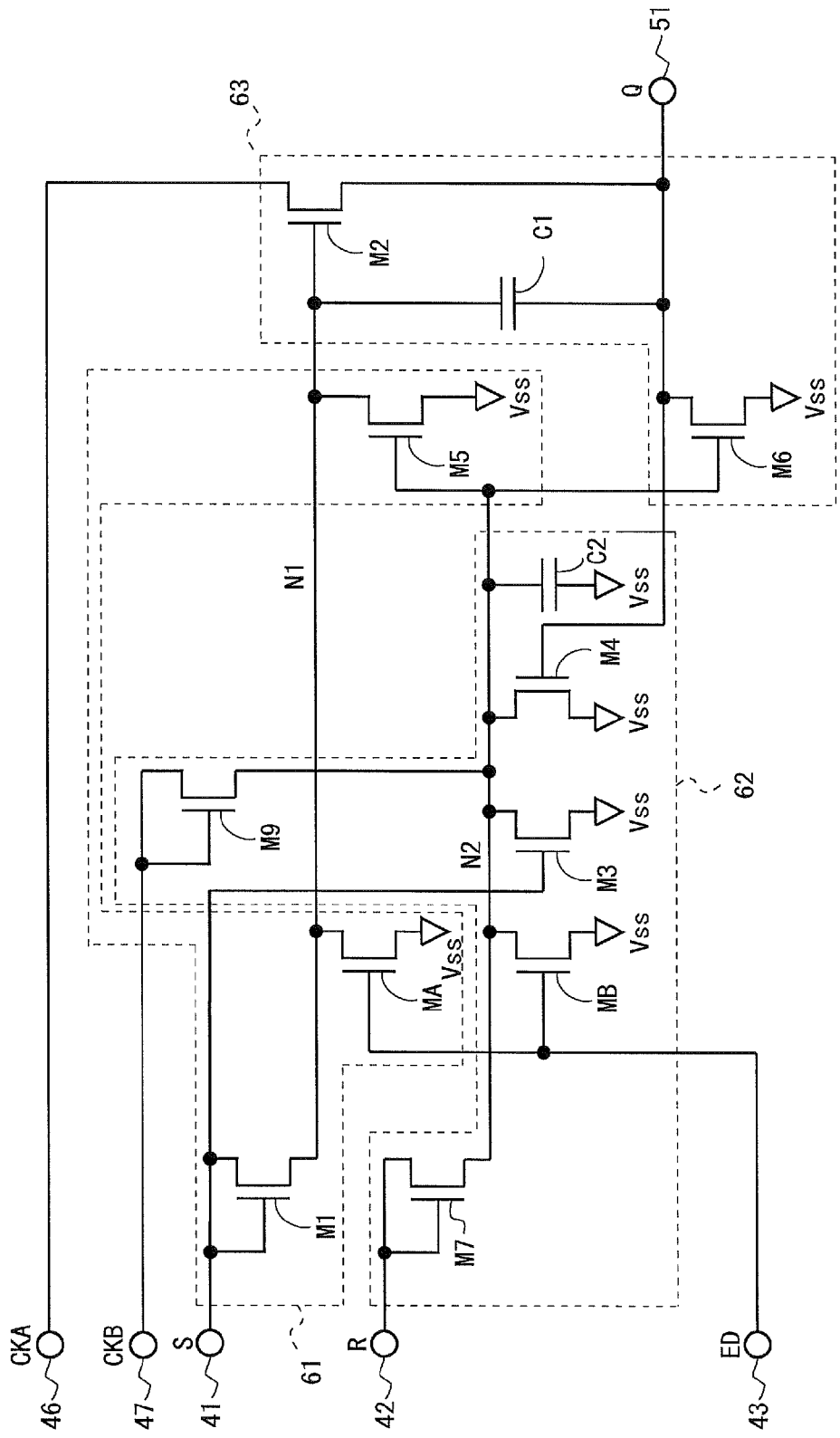
FIG. 8 is a circuit diagram illustrating a configuration of a bistable circuit in a front stage in the first embodiment.

FIG. 8 is a circuit diagram illustrating the configuration of a bistable circuit in the first stage (front stage) in the present embodiment. As illustrated in FIG. 8, this bistable circuit is not provided with the thin film transistor M8 and the input terminal 44, different from bistable circuits other than the first stage (front stage) and the m-th stage (final stage) illustrated in FIG. 7. It should be noted that, since the other configuration of the bistable circuit is similar to that of the bistable circuits other than the first stage (front stage) and the m-th stage (final stage) illustrated in FIG. 7, its description will not be given.

Figure 9:
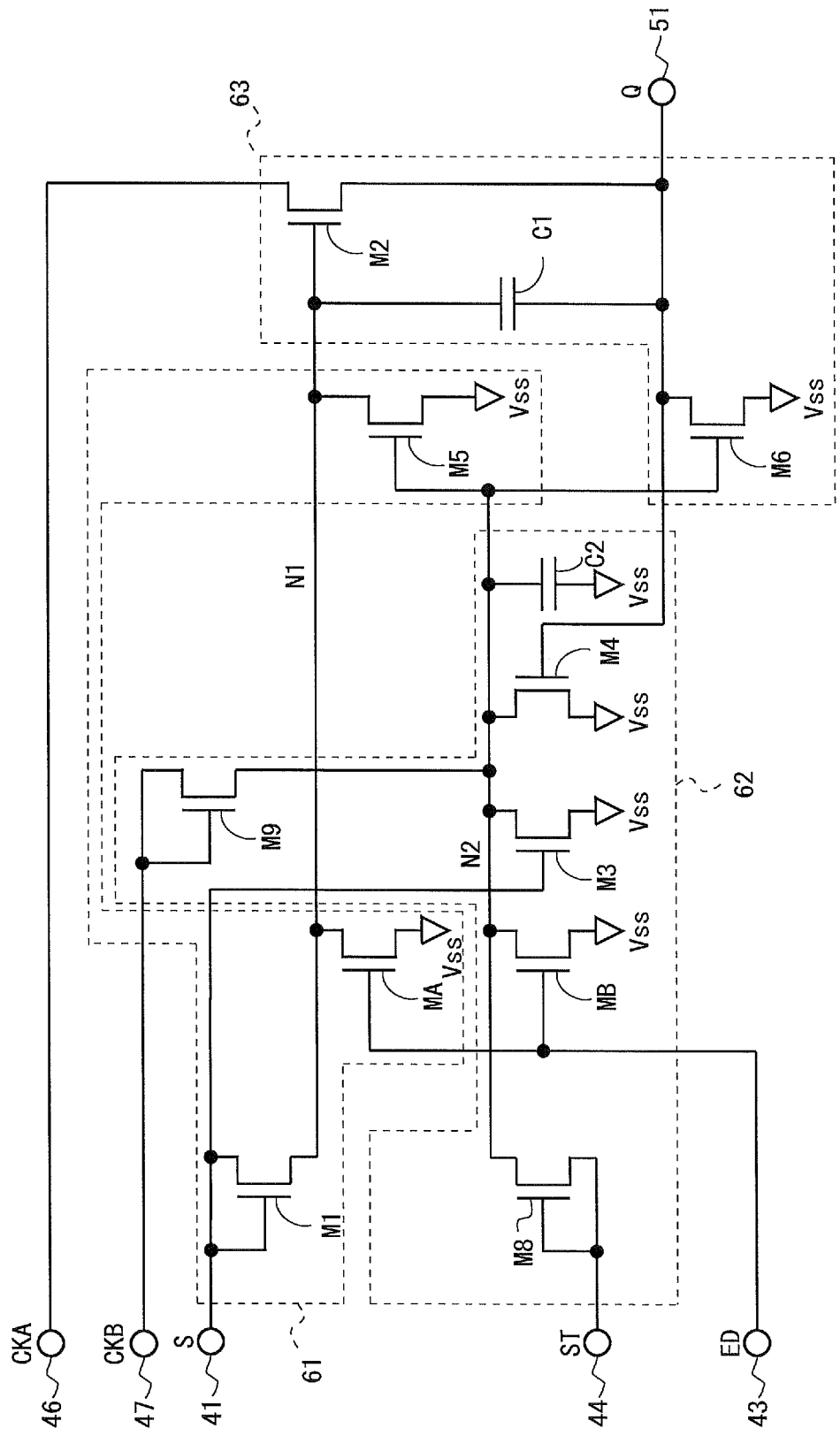
FIG. 9 is a circuit diagram illustrating a configuration of a bistable circuit in a final stage in the first embodiment.

FIG. 9 is a circuit diagram illustrating the configuration of the bistable circuit in the m-th stage (final stage) in the present embodiment. As illustrated in FIG. 9, this bistable circuit is not provided with the thin film transistor M7 and the input terminal 42, different from the bistable circuits other than the first stage (front stage) and the m-th stage (final stage) illustrated in FIG. 7. It should be noted that, since the other configuration of the bistable circuit is similar to that of the bistable circuits other than the first stage (front stage) and the m-th stage (final stage) illustrated in FIG. 7, its description will not be given.

In the present embodiment, the first-node-turn-on switching element is realized by the thin film transistor M1, the output control switching element is realized by the thin film transistor M2, a first second-node-turn-off switching element is realized by the thin film transistor M3, a second second-node-turn-off switching element is realized by the thin film transistor M4, a first-node-turn-off switching element is realized by the thin film transistor M5, an output-node-turn-off switching element is realized by the thin film transistor M6, a second-node-turn-on switching element is realized by the thin film transistor M7, a start switching element is realized by the thin film transistor M8, a charge replenishment switching element is realized by the thin film transistor M9, a first end switching element is realized by the thin film transistor MA, and a second end switching element is realized by the thin film transistor MB. A capacitive element is realized by the capacitor C1.

1.4 Operation of Bistable Circuit

Figure 10:
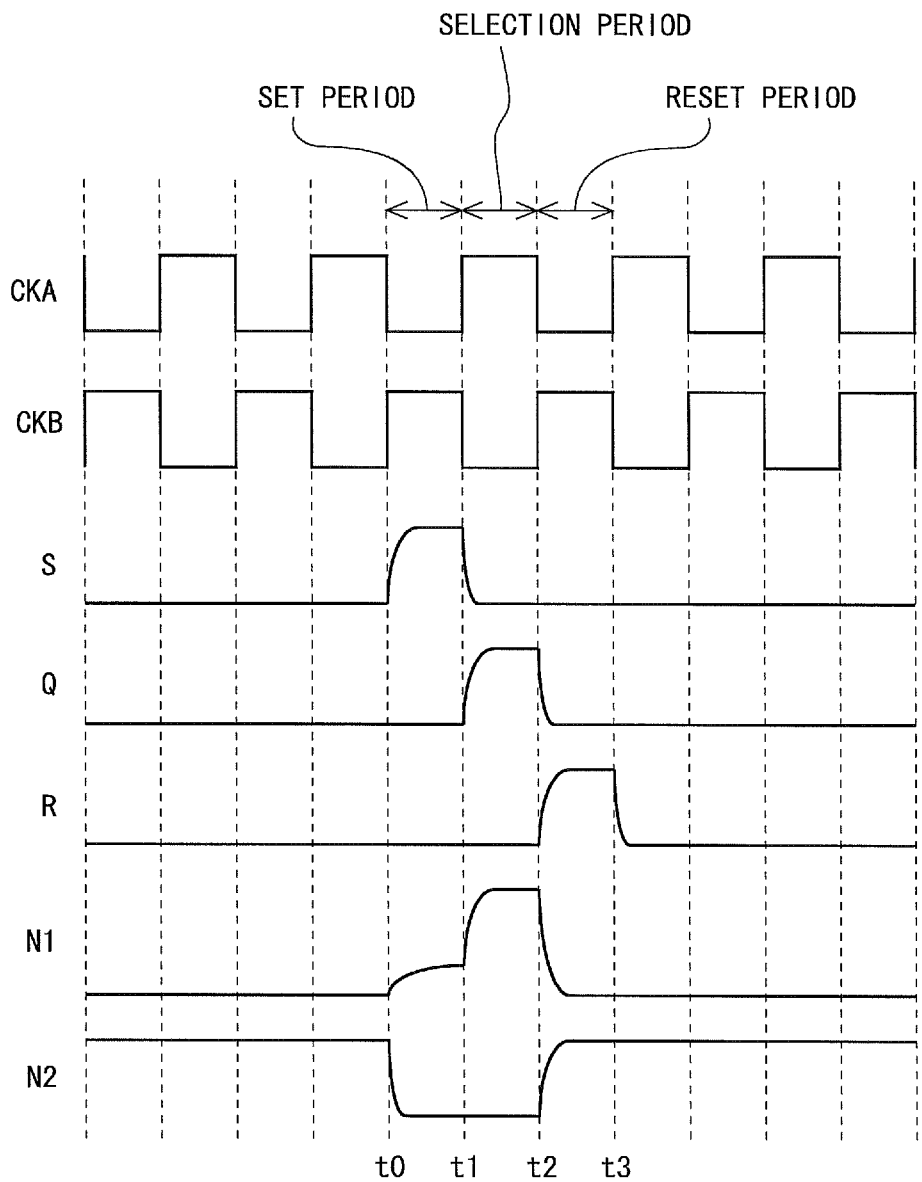
FIG. 10 is a signal waveform diagram for explaining the operation of the bistable circuit in the first embodiment.

FIG. 10 is a signal waveform diagram for explaining the operation of the bistable circuit 40(*i*) of the i-the stage in the present embodiment. It should be noted that, since the other bistable circuits operate similarly, their description will not be given. In FIG. 10, the period from the time point t1 to the time point t2 corresponds to a selection period. In the following, one horizontal scanning period just before the selection period will be called a "set period", and one horizontal scanning period immediately after the selection period will be called a "reset period". A period from the time point when the start signal ST (gate start pulse signal GSP) rises to the time point when the end signal ED (gate end pulse signal GEP) rises out of one vertical scanning period will be called a "write period". A period (predetermined period) from the time point when the end signal ED rises to the time point when the start signal ST in the following vertical scanning period rises out of one vertical scanning period will be called a "vertical blanking period". It should be noted that the period in which the end signal ED is at the low level out of the vertical blanking period will be particularly called a "pause period". The period other than the selection period, the set period, and the reset period, out of the write period will be called a "normal operation period".

In the normal operation period (the period before the time point t0 and the period after the time point t3 in the write period), the potential of the second node N2 is maintained at the high level. Consequently, the thin film transistors M5 and M6 are in the on state. Since parasite capacitance exists between the gate and drain of the thin film transistor M2, noise occurs in the first node N1 due to the fluctuation in the waveform of an operation control clock signal CKA (see FIG. 10). However, since the thin film transistor M5 is in the on state, the potential of the first node N1 is drawn to the low level. Although noise occurs also in the state signal Q (output terminal 51) due to noise which occurs in the first node N1 and fluctuation in a video signal voltage, since the thin film transistor M6 is in the on state, the potential of the state signal Q is drawn to the low level. Consequently, the potential of the first node N1 and the potential of the state signal Q are maintained at the low level in this period.

In the normal operation period, the potential of the charge replenishment clock signal CKB repeats the high level and the low level every one horizontal period, so that the thin film transistor M9 becomes the on state in one horizontal period every two horizontal scanning periods. Due to this, charges are supplied to the second node N2 via the thin film transistor M9. Consequently, even when the potential of the second node N2 decreases due to leak of current in a thin film transistor (for example, the thin film transistor M3), the potential of the second node N2 rises and the capacitor C2 is charged in the period in which the charge replenishment clock signal CKB is at the high level. Therefore, in the normal operation period, the potential of the second node N2 is reliably maintained at the high level.

In the set period (at time point t0), the set signal S changes from the low level to the high level. Since the thin film transistor M1 is diode-connected as illustrated in FIG. 7, by the set signal S becoming the high level, the thin film transistor M1 enters the on state, and the capacitor C1 is charged (pre-charged). Consequently, the potential of the first node N1 changes from the low level to the high level, and the thin film transistor M2 enters the on state. However, in the set period, the potential of the operation control clock signal CKA is at the low level, so that the potential of the state signal Q is maintained at the low level. Further, by the set signal S becoming the high level, the thin film transistor M3 enters the on state. Consequently, the potential of the second node N2 becomes the low level. It makes the thin film transistors M5 and M6 enter the off state.

In the selection period (at time point t1), the set signal S changes from the high level to the low level. Consequently, the thin film transistor M1 enters the off state. Since the potential of the second node N2 is at the low level at this time point, the thin film transistor M5 is in the off state. Therefore, the first node N1 enters a floating state. At time point t1, the potential of the operation control clock signal CKA changes from the low level to the high level. As described above, since parasitic capacitance exists between the gate and drain of the thin film transistor M2, as the potential of the input terminal 46 rises, the potential of the first node N1 also rises (the first node N1 is bootstrapped). As a result, the thin film transistor M2 completely enters the on state and the potential of the state signal Q rises to a sufficient level for the gate line connected to the output terminal 51 of this bistable circuit to enter a selection state. In such a manner, the output unit 63 outputs an active state signal when the potential of the first node N1 is at the high level (on level), the potential of the second node N2 is at the low level (off level), and the set signal S as a signal received by the first driving unit 61 (the signal supplied to the thin film transistor M1) is at the low level (off level). Since the thin film transistor M4 enters the on state by the potential of the state signal Q becoming the high level, the potential of the second node N2 reliably becomes the low level. Consequently, in the selection period, the thin film transistors M5 and M6 are reliably maintained in the off state.

In the reset period (at time point t2), the potential of the operation control clock signal CKA changes from the high level to the low level. Since the thin film transistor M2 is in the on state at time point t2, the potential of the state signal Q decreases with decrease of the potential of the input terminal 46. By the potential of the state signal Q decreasing as described above, the potential of the first node N1 also decreases via the capacitor C1. In this period, the reset signal R changes from the low level to the high level. Consequently, the thin film transistor M7 enters the on state, and the potential of the second node N2 becomes the high level. Thus, the thin film transistors M5 and M6 enter the on state. As a result, in the reset period, the potential of the first node N1 and the potential of the state signal Q decrease to the low level. Since the capacitor C2 is charged as the potential of the second node N2 rises, the potential (high level) of the second node N2 is maintained also after the reset period. It should be noted that, in the bistable circuit 40(*m*) in the m-th stage (final stage), in the reset period, by the end signal ED changing from the low level to the high level, the thin film transistors M5 and M6 enter the on state. As a result, also in the bistable circuit 40(*m*) in the m-th stage, the potential of the first node N1 and the potential of the state signal Q decrease to the low level in the reset period.

The operation of the bistable circuit in the write period has been described above. The operation of the bistable circuit in the vertical blanking period will be described later together with detailed operation of the gate driver 400.

1.5 Configuration of Clock Control Circuit

Figure 11:
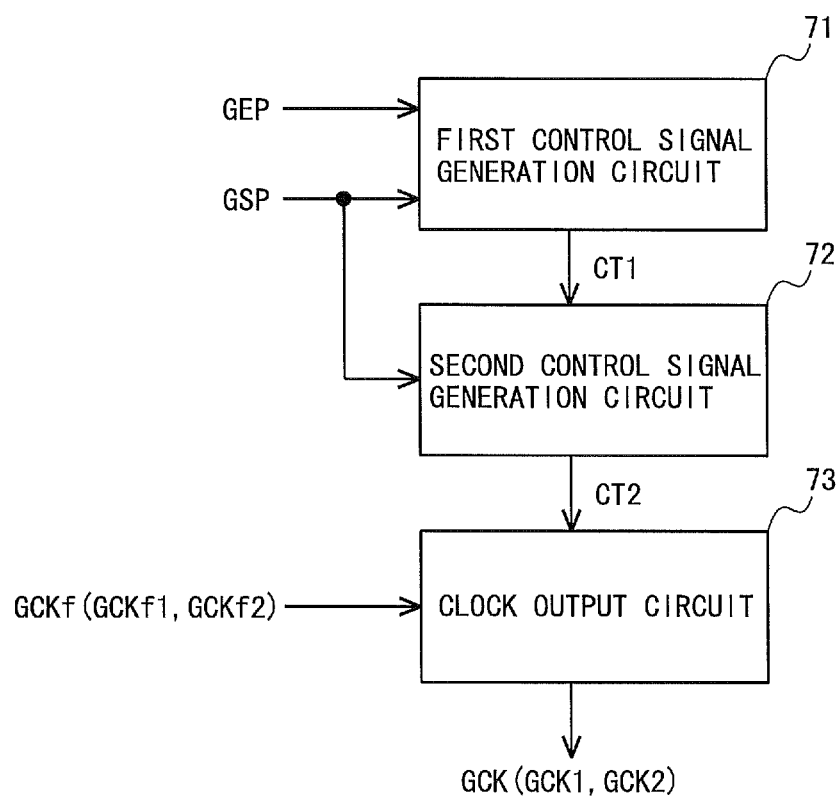
FIG. 11 is a block diagram illustrating a configuration of a clock control circuit in the first embodiment.

FIG. 11 is a block diagram illustrating the configuration of the clock control circuit 420 in the present embodiment. The clock control circuit 420 is provided in the gate driver 400 as described above. As illustrated in FIG. 11, the clock control circuit 420 is configured by a first control signal generation circuit 71, a second control signal generation circuit 72, and a clock output circuit 73.

Figure 12:
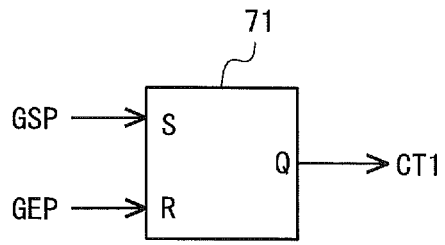
FIG. 12 is a circuit diagram illustrating a configuration of a first control signal generation circuit in the first embodiment.

To the first control signal generation circuit 71, the gate start pulse signal GSP and the gate end pulse signal GEP are supplied from the display control circuit 200. The first control signal generation circuit 71 generates a first control signal CT1 based on the received gate start pulse signal GSP and the received gate end pulse signal GEP and outputs the first control signal CT1. The first control signal generation circuit 71 is realized by an RS latch circuit, for example, as illustrated in FIG. 12. The first control signal generation circuit 71 receives the gate start pulse signal GSP and the gate end pulse signal GEP as the set signal S and the reset signal R, respectively, and outputs the first control signal CT1 as the state signal Q.

Figure 13:
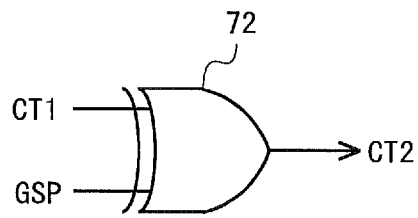
FIG. 13 is a circuit diagram illustrating a configuration of a second control signal generation circuit in the first embodiment.

To the second control signal generation circuit 72, the first control signal CT1 is supplied from the first control signal generation circuit 71 and the gate start pulse signal GSP is supplied from the display control circuit 200. The second control signal generation circuit 72 generates a second control signal CT2 based on the received first control signal CT1 and the received gate start pulse signal GSP and outputs the second control signal CT2. The second control signal generation circuit 72 is realized by an XOR (exclusive OR) circuit, for example, as illustrated in FIG. 13. The second control signal generation circuit 72 receives the first control signal CT1 and the gate start pulse signal GSP as first and second inputs, respectively, and outputs the second control signal CT2.

Figure 14:
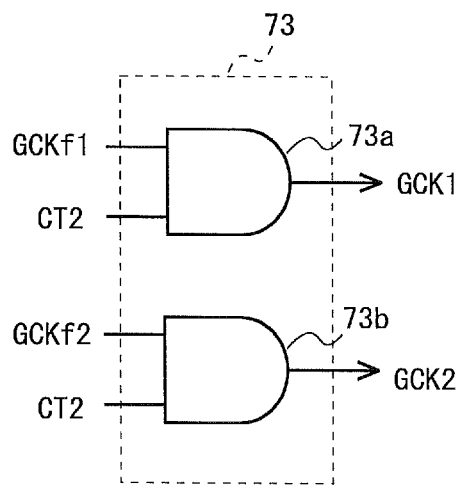
FIG. 14 is a circuit diagram illustrating a configuration of a clock output circuit in the first embodiment.

To the clock output circuit 73, the pre-control gate clock signal GCKf (the first pre-control gate clock signal GCKf1 and the second pre-control gate clock signal GCKf2) are supplied from the display control circuit 200 and the second control signal CT2 is supplied from the second control signal generation circuit 72. The clock output circuit 73 generates the post-control gate clock signal GCK (the first post-control gate clock signal GCK1 and the second post-control gate clock signal GCK2) based on the received pre-control gate clock signal GCKf and the received second control signal CT2 and outputs the post-control gate clock signal GCK. The clock output circuit 73 is realized by two AND circuits 73a and 73b, for example, as illustrated in FIG. 14. It should be noted that, in the following, the AND circuit 73a as one of the two AND circuits will be called a "first AND circuit", and the AND circuit 73b as the other circuit will be called a "second AND circuit". The first AND circuit 73a receives the first pre-control gate clock signal GCKf1 and the second control signal CT2 and outputs AND of them as the first post-control gate clock signal GCK1. Similarly, the second AND circuit 73b receives the second pre-control gate clock signal GCKf2 and the second control signal CT2 and outputs AND of them as the second post-control gate clock signal GCK2. The first post-control gate clock signal GCK1 and the second post-control gate clock signal GCK2 which are output from the first AND circuit 73a and the second AND circuit 73b, respectively, are supplied to each of the bistable circuits in the shift register 410. It should be noted that the configuration of the clock control circuit 420 as shown above is merely an example and the present invention is not limited thereto.

1.6 Operation of Clock Control Circuit

Figure 15:
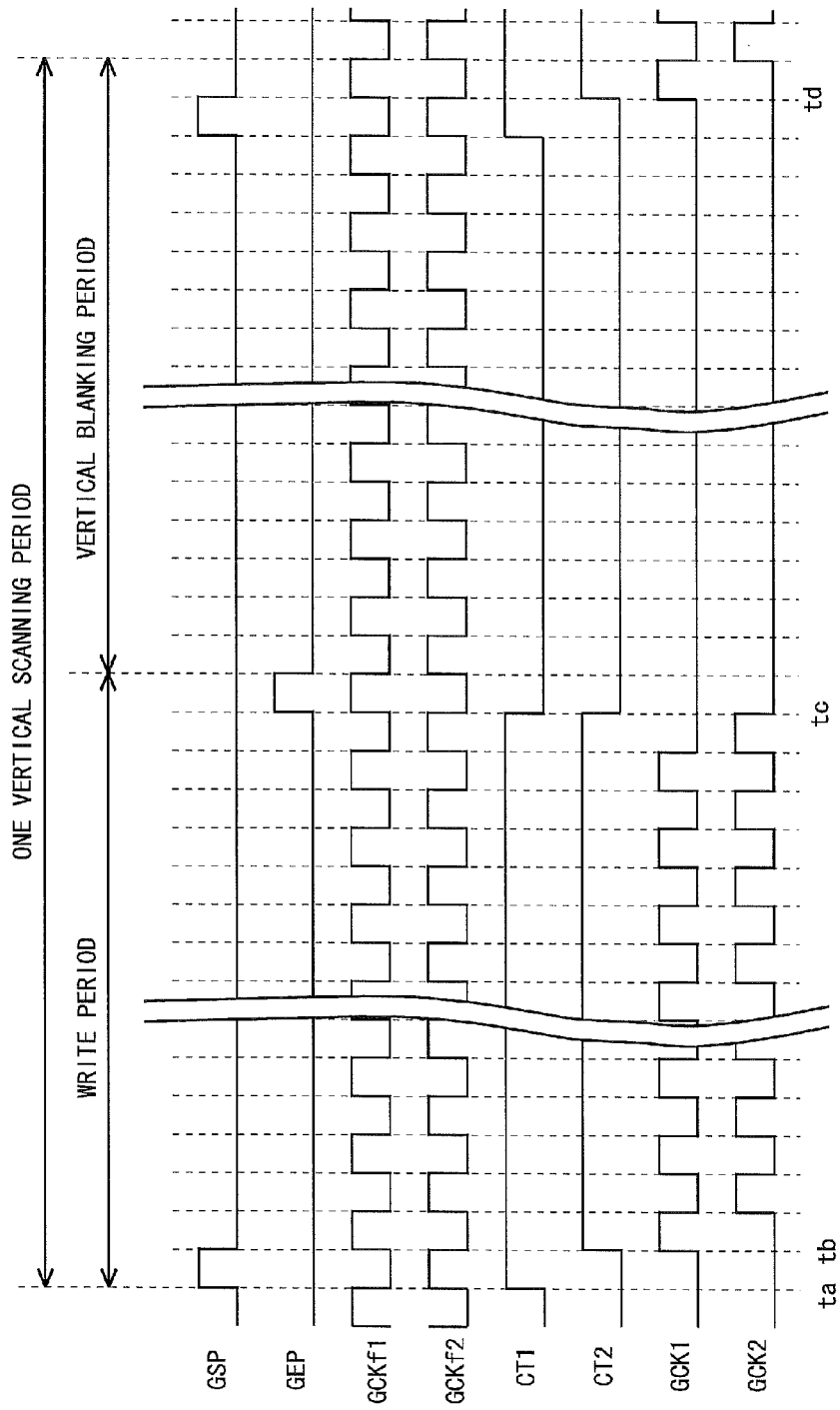
FIG. 15 is a signal waveform diagram for explaining the operation of the clock control circuit in the first embodiment.

FIG. 15 is a signal waveform diagram for explaining the operation of the clock control circuit 420 in the present embodiment. As illustrated in FIG. 15, the first pre-control gate clock signal GCK1f and the second pre-control gate clock signal GCKf2 periodically repeat the high level and the low level.

First, when a write period starts (at time point ta), the gate start pulse signal GSP changes from the low level to the high level. The gate end pulse signal GEP is at the low level. At this time, the set signal of the first control signal generation circuit 71 illustrated in FIG. 12 is at the high level, and the reset signal R is at the low level. Consequently, as illustrated in FIG. 15, the first control signal CT1 as the state signal Q of the first control signal generation circuit 71 becomes the high level. Accordingly, the first input of the second control signal generation circuit 72 illustrated in FIG. 13 becomes the high level, and the second input becomes the high level. Therefore, as illustrated in FIG. 15, the second control signal CT2 as an output of the second control signal generation circuit 72 becomes the low level. As a result, the first post-control gate clock signal GCK1 and the second post-control gate clock signal GCK2 become the low level. That is, supply of the pre-control gate clock signal GCKf to each bistable circuit is stopped at this time.

At time tb, the gate start pulse signal GSP changes from the high level to the low level. The gate end pulse signal GEP is at the low level. At this time, the set signal of the first control signal generation circuit 71 illustrated in FIG. 12 is at the low level, and the reset signal R is at the low level. Consequently, as illustrated in FIG. 15, the first control signal CT1 as the state signal Q of the first control signal generation circuit 71 maintains the high level as the previous state (the state at the time point ta). Accordingly, the first input of the second control signal generation circuit 72 illustrated in FIG. 13 becomes the high level, and the second input becomes the low level. Therefore, as illustrated in FIG. 15, the second control signal CT2 as an output of the second control signal generation circuit 72 becomes the high level. As a result, the first pre-control gate clock signal GCKf1 and the second pre-control gate clock signal GCKf2 are output as the first post-control gate clock signal GCK1 and the second post-control gate clock signal GCK2, respectively. That is, the pre-control gate clock signal GCKf is supplied to each bistable circuit at this time. This state is maintained until the gate end pulse signal GEP changes from the low level to the high level (until time point tc).

At time tc, the gate end pulse signal GEP changes from the low level to the high level. The gate start pulse signal GSP is at the low level. At this time, the set signal of the first control signal generation circuit 71 illustrated in FIG. 12 is at the low level, and the reset signal R is at the high level. Consequently, as illustrated in FIG. 15, the first control signal CT1 as the state signal Q of the first control signal generation circuit 71 becomes the low level. Accordingly, the first input of the second control signal generation circuit 72 illustrated in FIG. 13 becomes the low level, and the second input becomes the low level. Therefore, as illustrated in FIG. 15, the second control signal CT2 as an output of the second control signal generation circuit 72 becomes the low level. As a result, the first post-control gate clock signal GCK1 and the second post-control gate clock signal GCK2 become the low level. That is, at this time, supply of the pre-control gate clock signal GCKf to each bistable circuit is stopped. This state is maintained until the gate start pulse signal GSP changes from the high level to the low level (until time point td) in the write period of a subsequent vertical scanning period.

As described above, in the present embodiment, in the vertical blanking period as a period from the time point when the gate end pulse signal GEP (end signal ED) falls until the time point when the gate start pulse signal GSP (start signal ST) rises in the subsequent vertical scanning period, out of one vertical scanning period, both of the first post-control gate clock signal GCK1 and the second post-control gate clock signal GCK2 become the low level. That is, in the vertical blanking period, supply of the first pre-control gate clock signal GCKf1 and the second pre-control gate clock signal GCKf2 to each bistable circuit is stopped. It should be noted that the operation of the clock control circuit 420 as described above is merely an example and the present invention is not limited thereto.

1.7 Detailed Operation of Gate Driver

Figure 16:
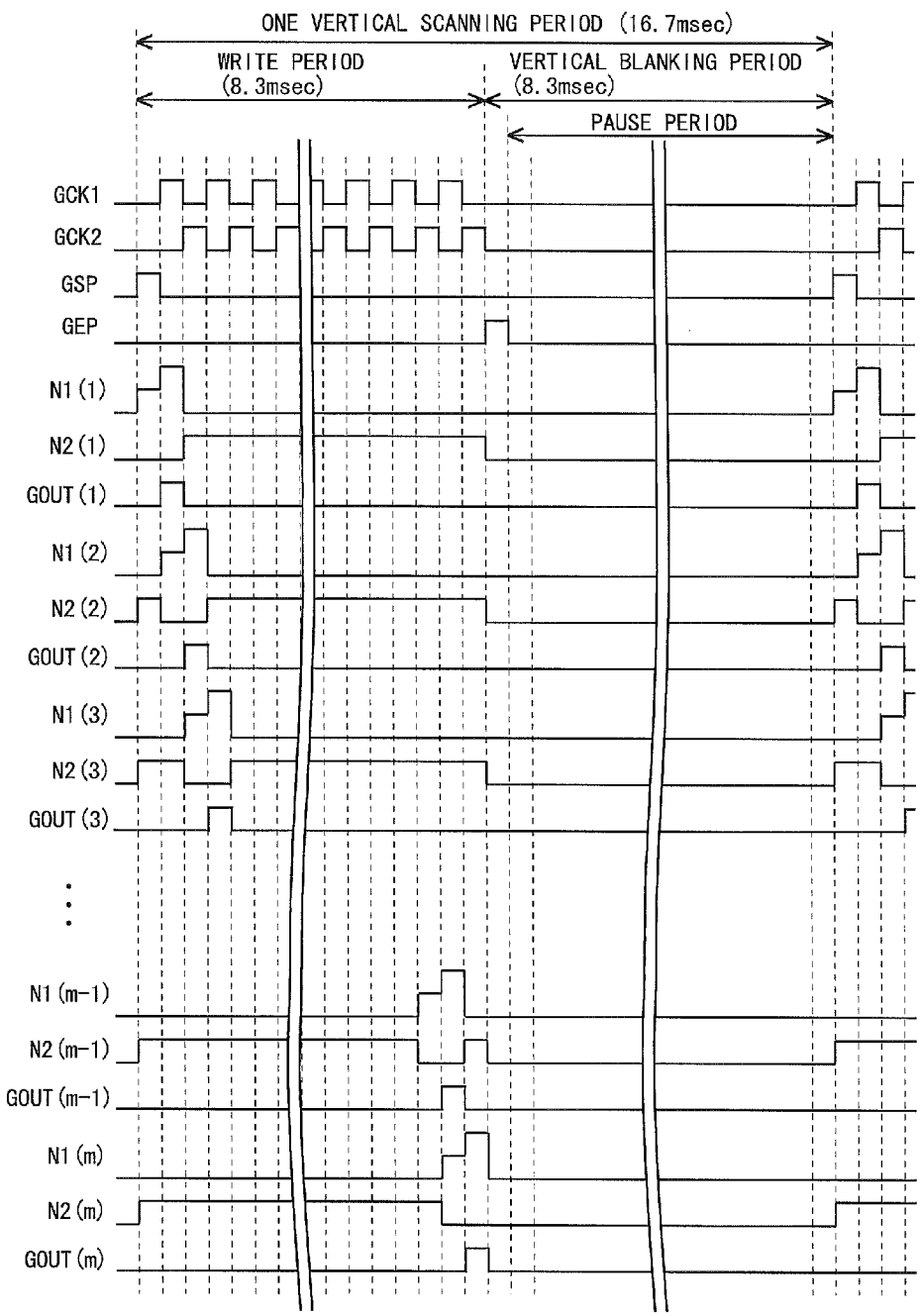
FIG. 16 is a signal waveform diagram for explaining the detailed operation of the gate driver in the first embodiment.

FIG. 16 is a signal waveform diagram for explaining detailed operation of the gate driver 400 in the present embodiment. In the present embodiment and each of embodiments which will be described later, it is described on assumption that driving at 60 Hz (about 16.7 msec) which is a general drive frequency in one vertical scanning period is performed. As illustrated in FIG. 16, in the present embodiment, the vertical blanking period (about 8.3 msec) of the length of about 1/2 of one vertical scanning period is provided. In accordance with this, the drive frequency in the write period is set to 120 Hz (about 8.3 msec) which is twice as high as the general drive frequency. That is, in the present embodiment, the length of the write period and that of the vertical blanking period are almost equal to each other. It should be noted that, in the following, for convenience of explanation, the first nodes N1 in the first stage 40(1) to the m-th stage 40(m) are expressed by reference numerals N1(1) to N1(m), respectively, and the second nodes N2 are expressed by reference numerals N2(1) to N2(m), respectively. The first nodes N1(1) to N1(m) will be called a "first node in the first stage to first node in the m-th stage", respectively, and the second nodes N2(1) to N2(m) will be called a "second node in the first stage to second node in the m-th stage", respectively.

First, the operation of the gate driver 400 in the write period will be described. In the set period for the first stage 40(1), the potential of the gate start pulse GSP as the set signal S in the first stage 40(1) changes from the low level to the high level, so that the first node N1(1) in the first stage is precharged. Since the set signal S changes from the low level to the high level, the thin film transistor M3 enters the on state, and the second node N2(1) in the first stage is maintained at the low level. It should be noted that, at this time, the potential of the first post-control gate clock signal GCK1 and the potential of the second post-control gate clock signal GCK2 are at the low level. Moreover, by the potential of the gate start pulse signal GSP changing from the low level to the high level, as illustrated in FIGS. 7 and 8, the thin film transistor M8 in the second stage 40(2) to the m-th stage 40(m) enters the on state. Consequently, the potential of the second nodes N2(2) to N2(m) in the second to the m-th stages changes from the low level to the high level. As described above, by the potential of the second nodes N2(2) to N2(m) in the second to m-th stages becoming the high level, the potential of the first nodes N1(2) to N1(m) in the second to m-th stages can be reliably maintained at the low level.

Next, in the selection period in the first stage 40(1) (the set period in the second stage 40(2)), the potential of the first post-control gate clock signal GCK1 as the operation control clock signal CKA in the first stage 40(1) changes from the low level to the high level, thereby bootstrapping the first node N1(1) in the first stage. As a result, the potential of the scanning signal GOUT(1) in the first stage 40(1) becomes the high level (active). In the second stage 40(2), the potential of the scanning signal GOUT(1) in the first stage 40(1) as the set signal S changes from the low level to the high level, so that the first node N1(2) in the second stage is precharged. Since the set signal S changes from the low level to the high level, the thin film transistor M3 enters the on stage, and the potential of the second node N2(2) in the second stage changes from the high level to the low level.

Next, in the reset period in the first stage 40(1) (the selection period in the second stage 40(2) and the set period in the third stage 40(3)), the potential of the scanning signal GOUT (2) in the second stage 40(2) as the reset signal R in the first stage 40(1) changes from the low level to the high level, so that the potential of the second node N2(1) in the first stage changes from the low level to the high level. Consequently, the potential of the first node N1(1) in the first stage changes from the high level to the low level. Therefore, the potential of the scanning signal GOUT(1) in the first stage 40(1) changes from the high level to the low level. It should be noted that the potential (high level) of the second node N2(1) in the first stage is maintained until the end time point of the write period (the time point when the gate end pulse signal GEP rises). In the second stage 40(2), the potential of the second post-control gate clock signal GCK2 as the operation control clock signal CKA changes from the low level to the high level, thereby bootstrapping the first node N1(2) in the second stage. As a result, the potential of the scanning signal GOUT (1) in the second stage 40(2) becomes the high level (active). In the third stage, the scanning signal GOUT(2) as the set signal S in the second stage 40(2) changes from the low level to the high level, so that the first node N1(3) in the third stage is precharged. Since the set signal S changes from the low level to the high level, the thin film transistor M3 enters the on stage, and the potential of the second node N2(3) in the third stage changes from the high level to the low level.

Subsequently, until the end time point of the write period, similar operation is performed in each of the stages except for the m-th stage 40(m) every one horizontal scanning period. In the m-th stage 40(m), the thin film transistor M7 and the input terminal 42 are not provided as described above. Consequently, an operation for changing the scanning signal GOUT (m) from the high level to the low level in the m-th stage 40(m) is performed based on the end signal ED (gate end pulse signal GEP) in place of the reset signal R. It should be noted that, in the following, an operation for changing the scanning signal from the high level to the low level in the reset period in each stage will be called a "reset operation". The reset operation in the m-th stage 40(m) is performed in the first one horizontal scanning period in the vertical blanking period.

Next, the operation of the gate driver 400 in the vertical blanking period will be described. First, in the vertical blanking period, the gate end pulse signal GEP changes from the low level to the high level. Consequently, in each stage which receives the gate end pulse signal GEP as the end signal ED, the thin film transistors MA and MB enter the on state. Consequently, the potential of the first node N1(1) in the first stage to the first node N1(m−1) in the (m−1) th stage is reliably maintained at the low level, and the potential of the second node N2(1) in the first stage to the second node N2(m−1) in the (m−1)th stage changes from the high level to the low level.

In the m-th stage 40(m), the thin film transistors MA and MB enter the on state, so that the potential of the first node N1(m) in the m-th stage changes from the high level to the low level, and the potential of the scanning signal GOUT(m) changes from the high level to the low level. In such a manner, in the m-th stage 40(m), different from the other stages, reset operation is performed based on the end signal ED. In the m-th stage 40(m), by the thin film transistors MA and MB entering the on state, the potential of the second node N2(m) in the m-th stage is maintained at the low level. As described above, when the gate end pulse signal GEP changes from the low level to the high level, the potential of the first node N1 and that of the second node N2 in all of the stages become the low level. Moreover, when the gate end pulse signal GEP changes from the low level to the high level, supply of the first pre-control gate clock signal GCKf1 and the second pre-control gate clock signal GCKf2 is stopped by the clock control circuit 420. That is, the potential of the first post-control gate clock signal GCK1 and that of the second post-control gate clock signal GCK2 become the low level.

Next, when the gate end pulse signal GEP changes from the high level to the low level in the vertical blanking period (in the pause period), the thin film transistors MA and MB in each stage enter the off state. In addition, all of the other thin film transistors also enter the off state. Consequently, in each stage, the first node N1 and the second node N2 enter the floating state. However, in the vertical blanking period, the potential of the first post-control gate clock signal GCK1 and the potential of the second post-control gate clock signal GCK2 are at the low level as described above. Consequently, the potential of the input terminal 46 does not fluctuate, so that potential fluctuation in the first node N1 caused by parasitic capacitance between the gate and drain of the thin film transistor M2 whose drain terminal is connected to the input terminal 46 does not occur. Similarly, potential fluctuation in the second node N2 caused by parasitic capacitance between the gate and drain of the thin film transistor M9 whose drain terminal is connected to the input terminal 47 does not occur. As described above, the potential of the first node N1 and the potential of the second node N2 in each stage are reliably maintained at the low level until the write period in the following vertical scanning period (until the gate start pulse signal GSP rises next). By the operation as described above, in the present embodiment, the pause period in which the potentials of all of signals supplied to the m bistable circuits, and the potential of the first node N1 and the potential of the second node N2 in each stage are at the low level is provided.

1.8 Effects

In the present embodiment, by the operation as described above, the potential of the second node N2 in each stage becomes the high level in the write period except for the set period and the selection period in the stage and becomes the low level in the set period, the selection period, and the vertical blanking period including the pause period in the stage. The length of the vertical blanking period is about 1/2 of one vertical scanning period. Consequently, the duty ratio of the potential of the second node N2 in each stage is substantially 1/2. That is, the duty ratio of the potential supplied to the gate terminal of the thin film transistor M5 and the gate terminal of the thin film transistor M6 becomes substantially 1/2. Consequently, the threshold shift in the thin film transistors M5 and M6 is suppressed. Therefore, according to the present embodiment, the reliability of the thin film transistors M5 and M6 can be increased. By increasing the reliability of the thin film transistors M5 and M6, the size of the thin film transistors M5 and M6 can be reduced. By reducing the size of the thin film transistors M5 and M6 as described above, power consumption can be reduced. Consequently, according to the present embodiment, while reducing power consumption, the reliability of the thin film transistors M5 and M6 can be increased. Further, by reducing the size of the thin film transistors M5 and M6, the picture-frame area of the liquid crystal display device can be reduced.

According to the present embodiment, in the vertical blanking period, supply of the first pre-control gate clock signal GCKf1 and the second pre-control gate clock signal GCKf2 is stopped, so that the potential of the first node N1 and the potential of the second node N2 in each stage are reliably maintained at the low level. Consequently, the duty ratio of the potential of the second node N2 in each stage is reliably lowered as compared with that in the conventional technique. Thus, by reliably suppressing the threshold shift in the thin film transistors M5 and M6, the reliability of the thin film transistors M5 and M6 can be reliably increased.

Generally, consumption power W required to drive a capacitive load is proportional to the product of the square of voltage (amplitude) V, a capacitance value C, and a frequency f. In the gate driver, as the number of thin film transistors in which a clock signal is supplied to the gate terminal increases, the capacitance value C increases. In other words, in the gate driver, as the number of thin film transistors in which a clock signal is supplied to the gate terminal increases, the consumption power W increases. In the gate driver described in Patent Document 2, there are four transistors T4, T5, T9, and T11 each having a gate terminal to which a clock signal CK1 is supplied directly or via another transistor, and there are three transistors T6, T8, and T10 each having a gate terminal to which a clock signal CK2 is supplied directly or via another transistor. On the other hand, in the present embodiment, there is one thin film transistor T4 having a gate terminal to which the operation control clock signal CKA is supplied directly or via another transistor, and there are three thin film transistors M5, M6, and M9 each having a gate terminal to which the charge replenishment clock signal CKB is supplied directly or via another transistor. Consequently, the power consumption W of the gate driver 400 in the present embodiment is reduced more than that of the gate driver described in Patent Document 2.

According to the present embodiment, in accordance with the length of the vertical blanking period, the drive frequency in the write period is increased (the write period is shortened). That is, the frequency of the pre-control gate clock signal GCKf is increased, so that the length of one vertical scanning period is the same as that in the conventional technique. Consequently, without decreasing a substantial drive frequency, the reliability of the thin film transistors M5 and M6 can be increased.

According to the present embodiment, the clock control circuit 420 controls supply of the pre-control gate clock signal GCKf (the first pre-control gate clock signal GCKf1 and the second pre-control gate clock signal GCKf2) to a bistable circuit based on the gate start pulse signal GSP and the gate end pulse signal GEP. Consequently, control of the supply of the pre-control gate clock signal GCKf is performed reliability. Thus, the circuit operation can be made stable.

According to the present embodiment, the thin film transistor MB is provided in each stage, so that the potential of the second node N2 in each stage reliably becomes the low level at the start time in the vertical blanking period. Consequently, the duty ratio of the potential supplied to the gate terminal of the thin film transistor M5 and the gate terminal of the thin film transistor M6 decreases reliably, and the circuit operation becomes stable.

According to the present embodiment, the thin film transistor MA is provided in each stage, so that the potential of the first node N1 in each stage reliably becomes the low level at the start time of the vertical blanking period. Consequently, the duty ratio of the potential supplied to the gate terminal of the thin film transistor M5 and the gate terminal of the thin film transistor M6 decreases more reliably, and the circuit operation becomes more stable.

According to the present embodiment, the thin film transistor M4 is provided, so that the potential of the second node N2 becomes reliably the low level in the selection period. Thus, the circuit operation becomes more stable.

1.9 First Modification

Figure 17:
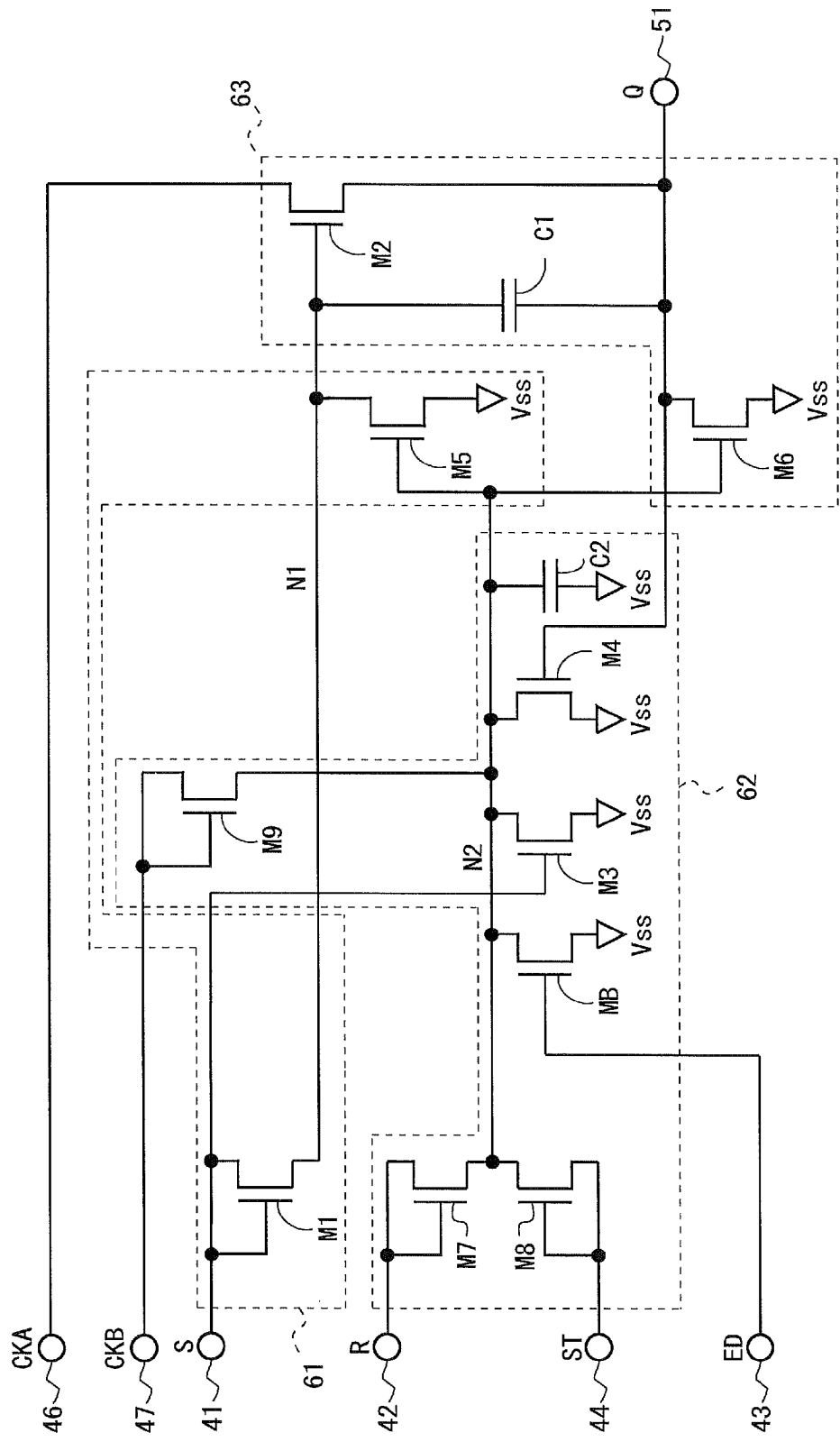
FIG. 17 is a circuit diagram illustrating a configuration of a bistable circuit in a stage other than front and final stages, in a first modification of the first embodiment.
Figure 18:
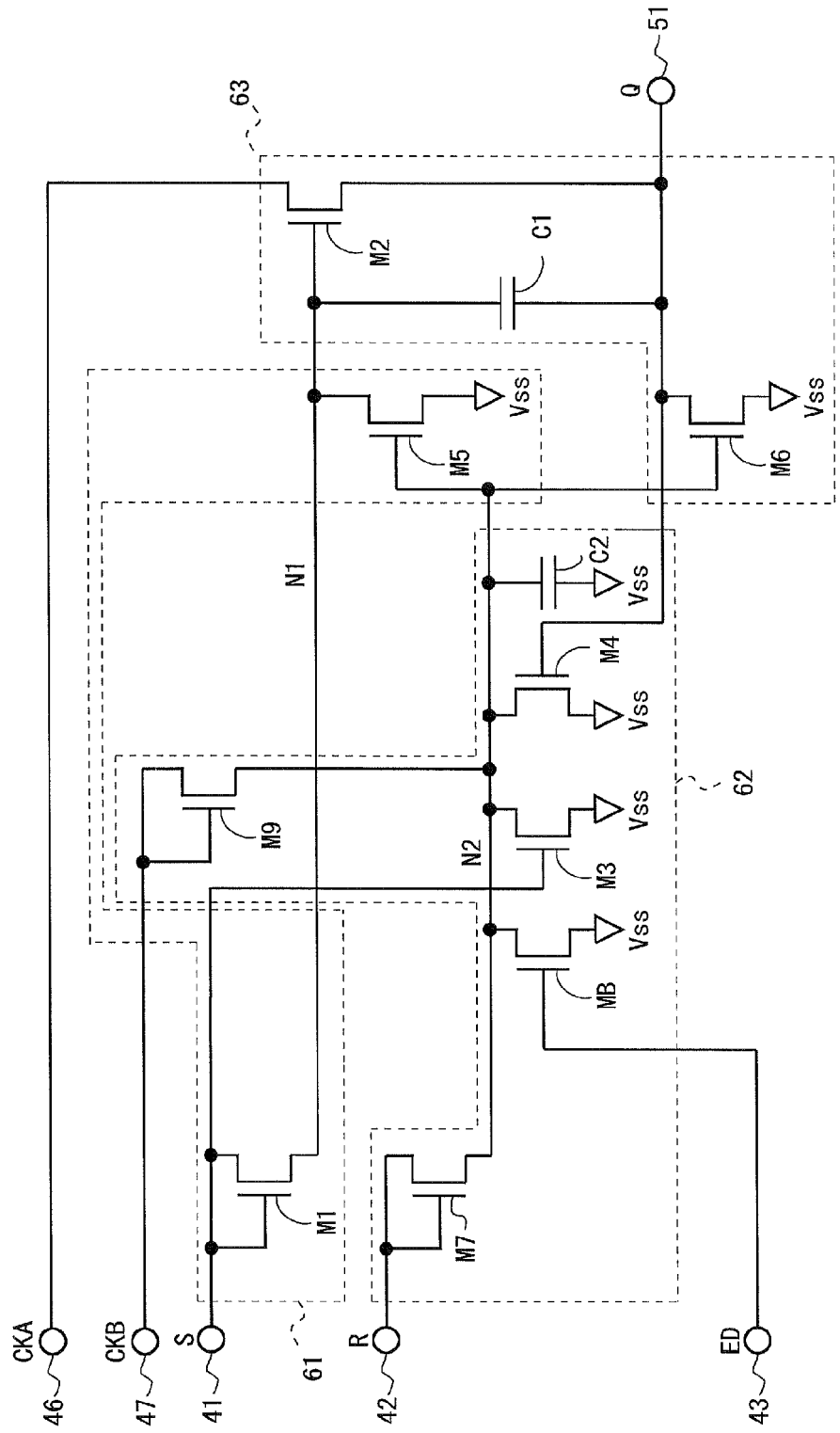
FIG. 18 is a circuit diagram illustrating a configuration of a bistable circuit in the front stage in the first modification of the first embodiment.

FIG. 17 is a circuit diagram illustrating a configuration of a bistable circuit in a stage other than the first stage (front stage) and the m-th stage (final stage), in a first modification of the first embodiment. FIG. 18 is a circuit diagram illustrating a configuration of a bistable circuit in the first stage (front stage) in the modification. Although the thin film transistor MA is provided in each of the stages in the first embodiment, in the modification, the thin film transistor MA is not provided in the first stage 40(1) to the (m−1)th stage 40(m−1) as illustrated in FIGS. 17 and 18. At the start time of the vertical blanking period, the potentials of the first node N1(1) in the first stage to the first node N1(m−1) in the (m−1)th stage are at the low level as illustrated in FIG. 16. Therefore, also in a mode that the thin film transistor MA is not provided for the first-stage 40(1) to the (m−1)th stage 40(m−1), the potentials of the first node N1(1) in the first stage to the first node N1(m−1) in the (m−1)th stage can be set to the low level in the vertical blanking period. It should be noted that, as for the m-th stage 40(m) in the modification, the thin film transistor MA is provided in a manner similar to the first embodiment. According to the modification, the number of the thin film transistors is decreased, so that power consumption can be further reduced, and the picture-frame area of the liquid crystal display device having the gate driver 400 can be further reduced.

1.10 Second Modification

Figure 19:
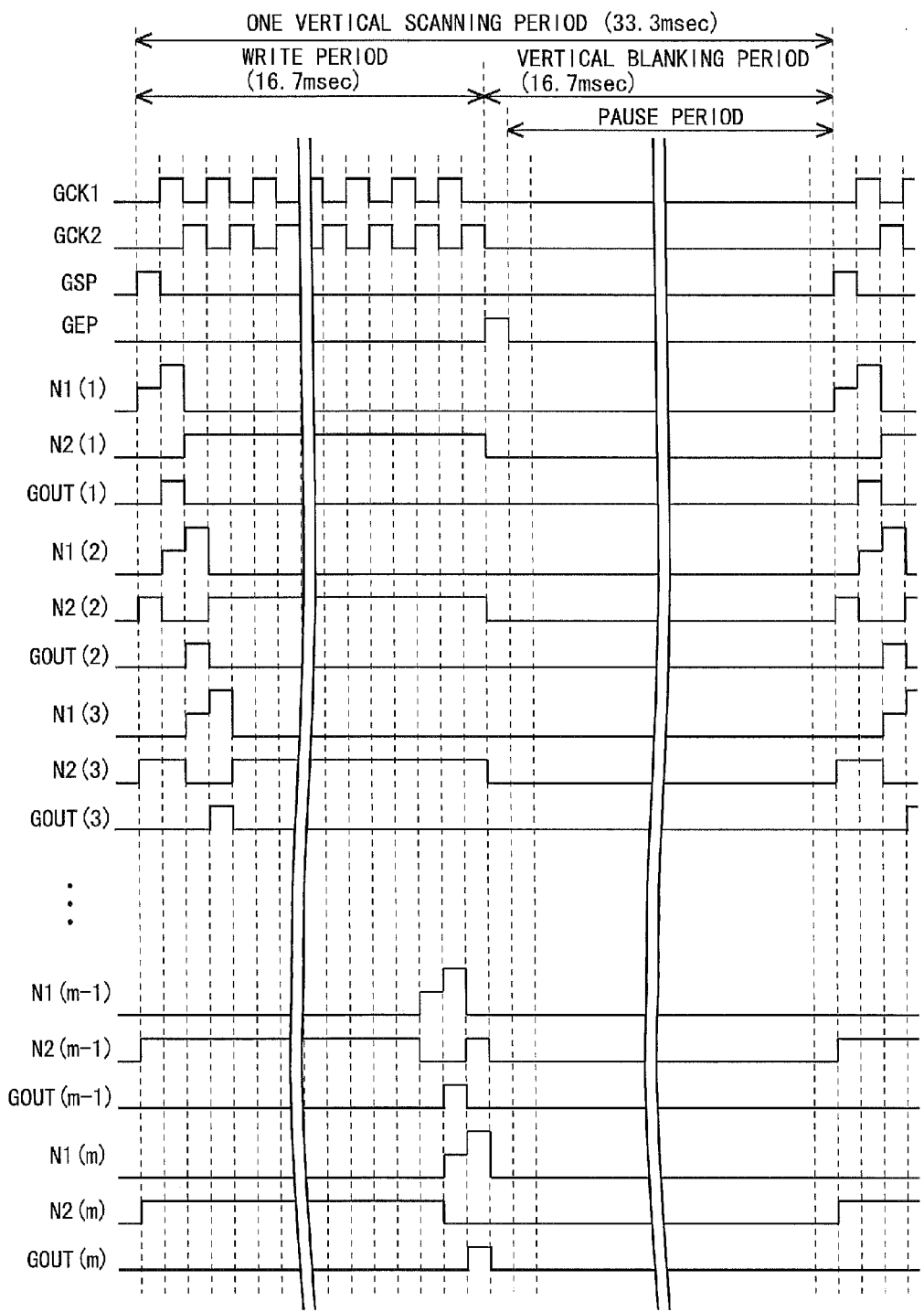
FIG. 19 is a signal waveform diagram for explaining the detailed operation of a gate driver in a second modification of the first embodiment.

FIG. 19 is a signal waveform diagram for explaining the detailed operation of the gate driver 400 in a second modification of the first embodiment. In the first embodiment, the drive frequency in one vertical scanning period is 60 Hz (about 16.7 msec. In the modification, as illustrated in FIG. 19, the drive frequency in one vertical scanning period is 30 Hz (about 33.3 msec). For example, when the drive frequency in the write period is 60 Hz (about 16.7 msec), the length of the vertical blanking period is about 16.7 msec which is about 1/2 of the length of the vertical scanning period. In this case, the duty ratio of the potential of the second node N2 in each stage is substantially 1/2, so that an effect similar to that of the first embodiment is obtained.

When the drive frequency in the write period is 120 Hz (about 8.3 msec) in the modification, the length of the vertical blanking period is about 25 msec which is about 3/4 of the length of the vertical scanning period. In this case, the length of the vertical blanking period is about three times as that of the write period, so that the duty ratio of the potential of the second node N2 in each stage is substantially 1/4. Therefore, the threshold shift of the thin film transistors M5 and M6 is further suppressed.

1.11 Third Modification

Figure 20:
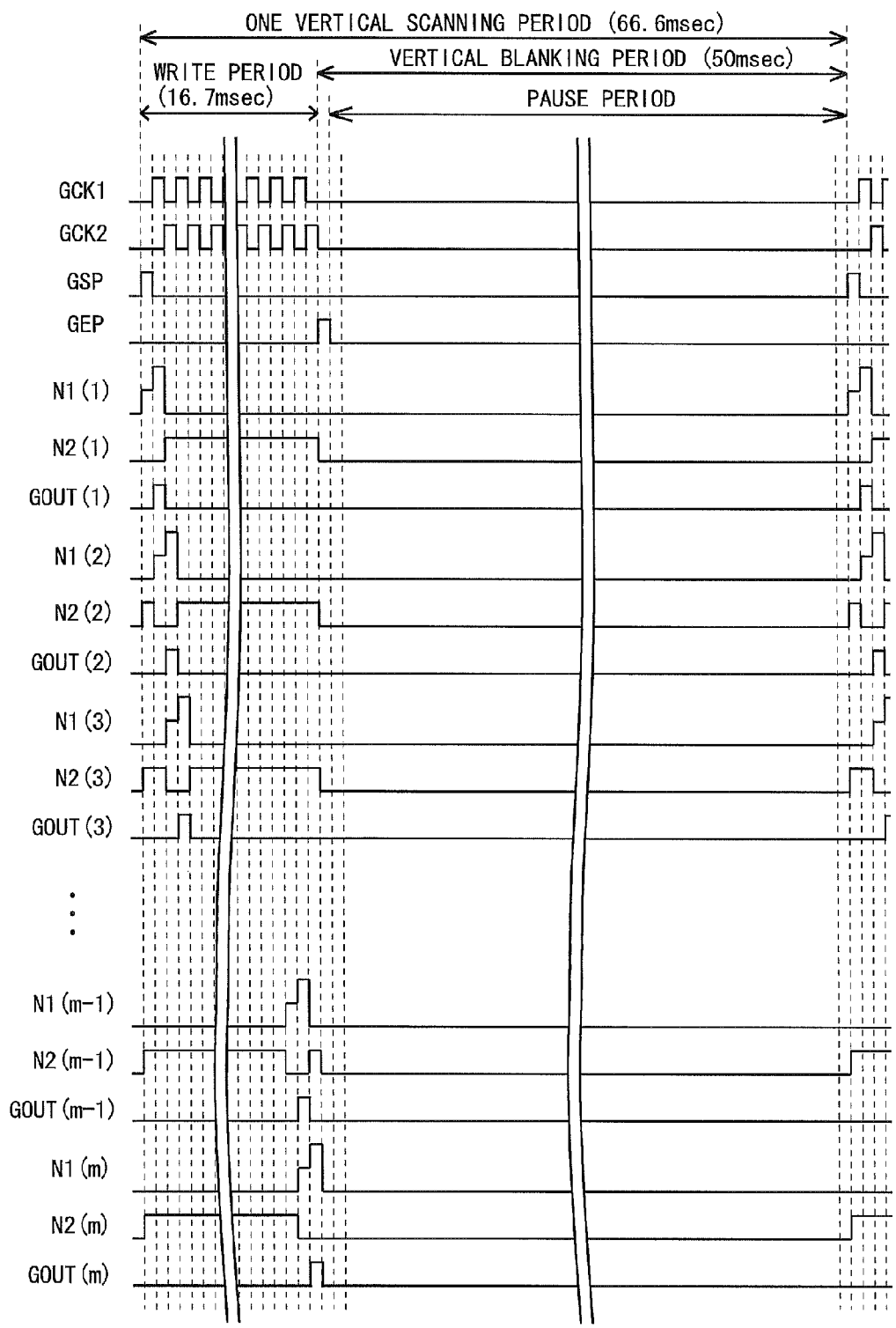
FIG. 20 is a signal waveform diagram for explaining the detailed operation of a gate driver in a third modification of the first embodiment.

FIG. 20 is a signal waveform diagram for explaining the detailed operation of the gate driver 400 in a third modification of the first embodiment. In the first embodiment, the drive frequency in one vertical scanning period is 60 Hz (about 16.7 msec). In the modification, as illustrated in FIG. 20, the drive frequency in one vertical scanning period is 15 Hz (about 66.6 msec). For example, when the drive frequency in the write period is 60 Hz (about 16.7 msec) in a manner similar to the second modification, the length of the vertical blanking period is about 50 msec which is about 3/4 of the length of the vertical scanning period. In this case, the length of the vertical blanking period becomes about three times as long as that of the write period, so that the duty ratio of the potential of the second node N2 in each stage becomes substantially 1/4. Therefore, the threshold shift in the thin film transistors M5 and M6 is suppressed more than that in the first embodiment.

When the drive frequency in the write period is 120 Hz (about 8.3 msec) in the modification, the length of the vertical blanking period is about 58.3 msec which is about 7/8 of the length of the vertical scanning period. In this case, the length of the vertical blanking period is about seven times as that of the write period, so that the duty ratio of the potential of the second node N2 in each stage is substantially 1/8. Therefore, the threshold shift of the thin film transistors M5 and M6 is further suppressed.

1.12 Fourth Modification

Figure 21:
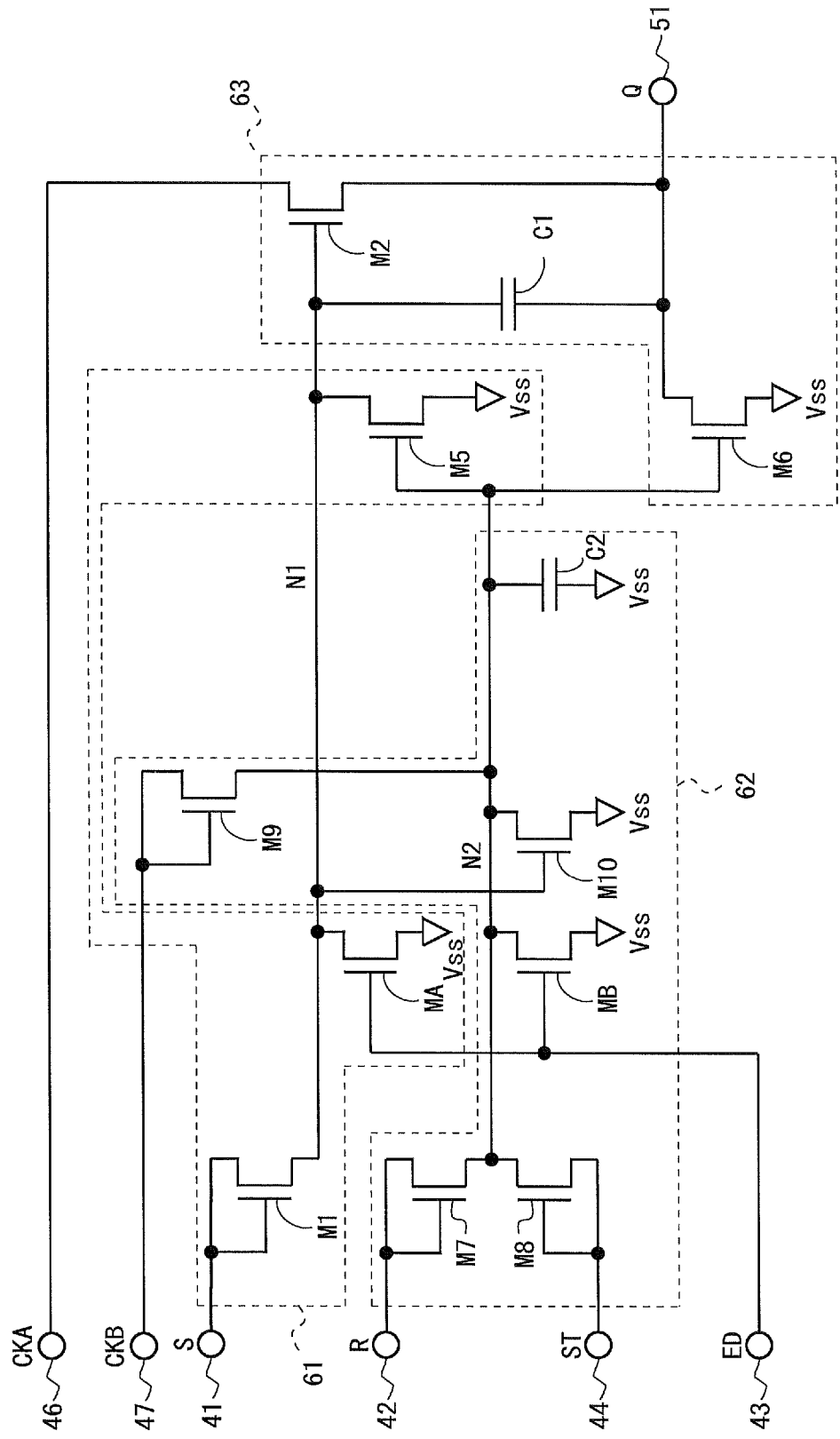
FIG. 21 is a circuit diagram illustrating a configuration of a bistable circuit in a stage other than front and final stages, in a fourth modification of the first embodiment.

FIG. 21 is a circuit diagram illustrating a configuration of a bistable circuit in a stage other than the first stage (front stage) and the m-th stage (final stage) in a fourth modification of the first embodiment. Although the thin film transistors M3 and M4 are provided in each of the stages in the first embodiment, in the modification, as illustrated in FIG. 21, the thin film transistor M10 is provided in place of the thin film transistors M3 and M4. It should be noted that, since the configuration in the first stage (front stage) and the m-th stage (final stage) is also similar to the above, their description and illustration will not be given. With respect to the thin film transistor M10, the gate terminal is connected to the first node N1, the drain terminal is connected to the second node, and the source terminal is connected to an input terminal for the DC power supply potential Vss. The thin film transistor M10 changes the potential of the second node N2 toward the Vss potential when the potential of the first node N1 is at the high level. In the modification, the second-node-turn-off switching element is realized by the thin film transistor M10. According to the modification, by providing each bistable circuit with the thin film transistor M10 in place of the thin film transistors M3 and M4, the potential of the second node N2 can be reliably maintained at the low level in the set period and the selection period.

2. Second Embodiment

2.1 Detailed Operation of Gate Driver

Figure 22:
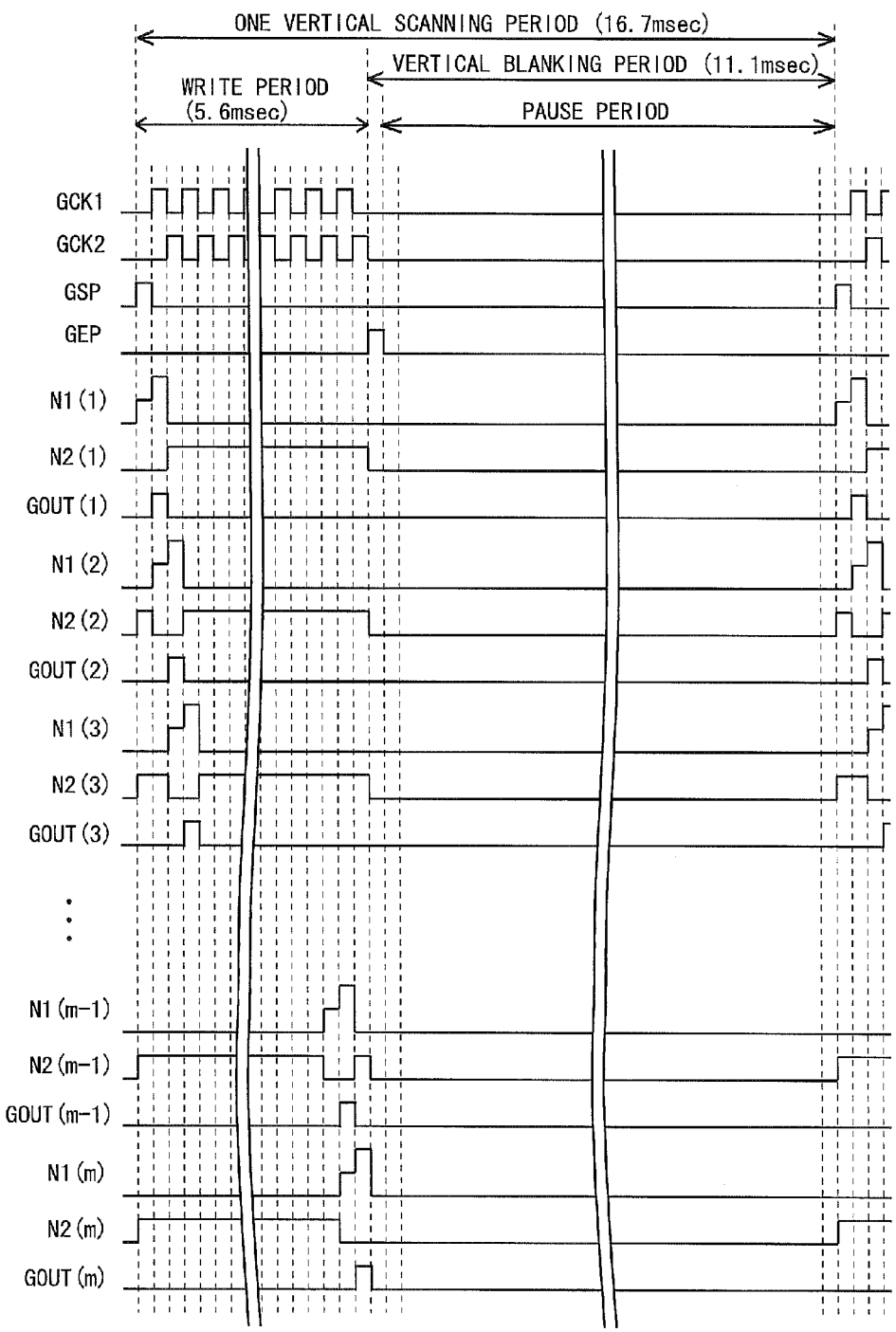
FIG. 22 is a signal waveform diagram for explaining the detailed operation of a gate driver in a second embodiment of the present invention.

FIG. 22 is a signal waveform diagram for explaining the detailed operation of the gate driver 400 in a second embodiment of the present invention. It should be noted that, since the general configuration and operation of a liquid crystal display device, the configuration of the gate driver 400, the configuration and operation of a bistable circuit, and the configuration and operation of the clock control circuit 420 in the present embodiment are similar to those of the first embodiment, their description will not be given.

In the first embodiment, the vertical blanking period (about 8.3 msec) whose length is about 1/2 of one vertical scanning period is provided, and the drive frequency in the write period is set to 120 Hz (about 8.3 msec) which is twice as high as the general drive frequency (60 Hz). On the other hand, in the present embodiment, as illustrated in FIG. 22, a vertical blanking period (about 11.1 msec) whose length is about 2/3 of one vertical scanning period is provided, and the drive frequency in the write period is set to 180 Hz (about 5.6 msec) which is three times as high as a general drive frequency. That is, in the present embodiment, the length of the vertical blanking period is about twice as long as that of the write period. It should be noted that, since the operation in the write period and the vertical blanking period in the present embodiment is similar to that in the first embodiment, its description will not be given.

2.2 Effects

In the present embodiment, the potential of the second node N2 in each stage becomes the high level in the write period except for the set period and the selection period in the stage and becomes the low level in the set period, the selection period, and the vertical blanking period including the pause period in the stage. In the present embodiment, the length of the vertical blanking period is about twice as long as the write period. Consequently, the duty ratio of the potential of the second node N2 in each stage is substantially 1/3. That is, the duty ratio of the potential supplied to the gate terminal of the thin film transistor M5 and the gate terminal of the thin film transistor M6 becomes substantially 1/3. Therefore, according to the present embodiment, the threshold shift in the thin film transistors M5 and M6 is suppressed more as compared with the first embodiment. Thus, the reliability of the thin film transistors M5 and M6 is further increased, so that the size of the thin film transistors can be further reduced. In the case of reducing the size of the thin film transistors M5 and M6 as described above, power consumption can be further reduced, and the picture-frame area of the liquid crystal display device having the gate driver 400 can be further reduced.

3. Third Embodiment 3.1 Detailed Operation of Gate Driver

Figure 23:
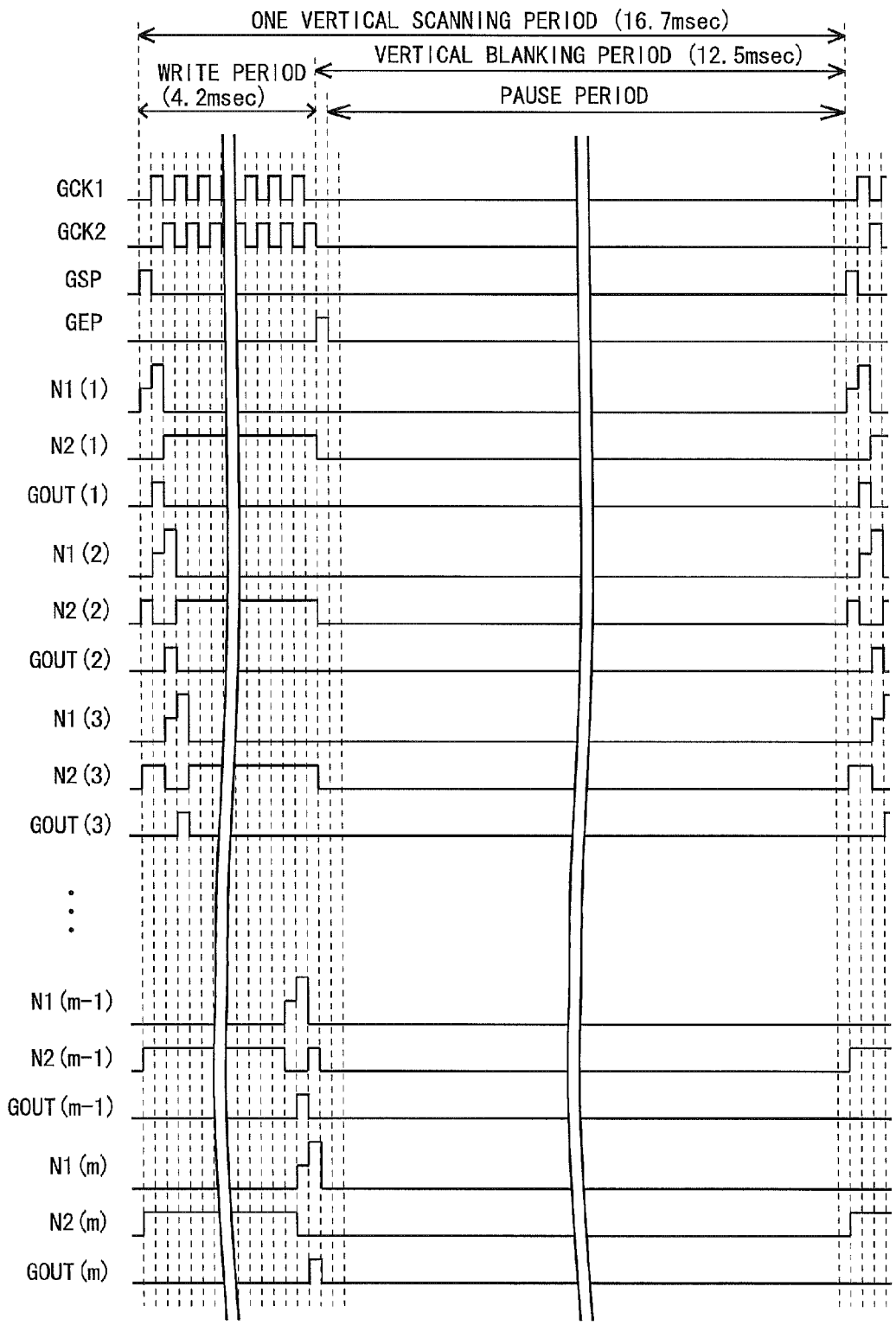
FIG. 23 is a signal waveform diagram for explaining the detailed operation of a gate driver in a third embodiment of the present invention.

FIG. 23 is a signal waveform diagram for explaining the detailed operation of the gate driver 400 in a third embodiment of the present invention. It should be noted that, since the general configuration and operation of a liquid crystal display device, the configuration of the gate driver 400, the configuration and operation of a bistable circuit, and the configuration and operation of the clock control circuit 420 in the present embodiment are similar to those of the first embodiment, their description will not be given.

In the first embodiment, the vertical blanking period (about 8.3 msec) whose length is about 1/2 of one vertical scanning period is provided, and the drive frequency in the write period is set to 120 Hz (about 8.3 msec) which is twice as high as the general drive frequency (60 Hz). In the second embodiment, the vertical blanking period (about 11.1 msec) whose length is about 2/3 of one vertical scanning period is provided, and the drive frequency in the write period is set to 180 Hz (about 5.6 msec) which is three times as high as the general drive frequency. On the other hand, in the present embodiment, a vertical blanking period (about 12.5 msec) whose length is about 3/4 of one vertical scanning period is provided, and the drive frequency in the write period is set to 240 Hz (about 4.2 msec) which is four times as high as a general drive frequency. That is, in the present embodiment, the length of the vertical blanking period is about three times as long as that of the write period. It should be noted that, since the operation in the write period and the vertical blanking period in the present embodiment is similar to that in the first embodiment, its description will not be given.

3.2 Effects

In the present embodiment, in a manner similar to the first embodiment, the potential of the second node N2 in each stage becomes the high level in the write period except for the set period and the selection period in the stage and becomes the low level in the set period, the selection period, and the vertical blanking period including the pause period in the stage. In the present embodiment, the length of the vertical blanking period is about three times as long as the write period. Consequently, the duty ratio of the potential of the second node N2 in each stage is substantially 1/4. That is, the duty ratio of the potential supplied to the gate terminal of the thin film transistor M5 and the gate terminal of the thin film transistor M6 becomes substantially 1/4. Therefore, according to the present embodiment, the threshold shift in the thin film transistors M5 and M6 is suppressed more as compared with the second embodiment. Thus, the reliability of the thin film transistors is further increased, so that the size of the thin film transistors can be further reduced. As a result, power consumption can be further reduced, and the picture-frame area of the liquid crystal display device having the gate driver 400 can be further reduced.

4. Fourth Embodiment 4.1 Detailed Operation of Gate Driver

Figure 24:
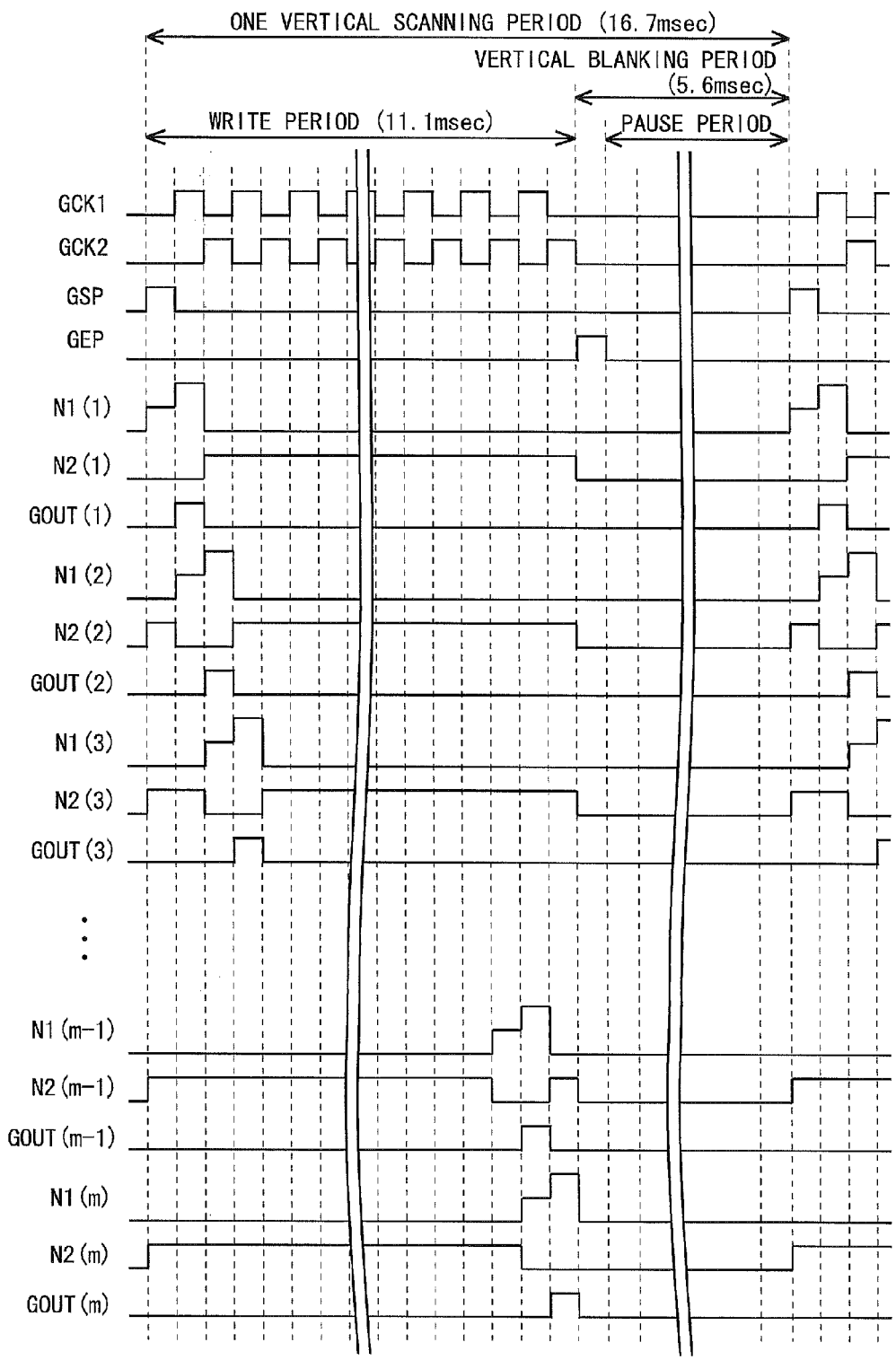
FIG. 24 is a signal waveform diagram for explaining the detailed operation of a gate driver in a fourth embodiment of the present invention.

FIG. 24 is a signal waveform diagram for explaining the detailed operation of the gate driver 400 in a fourth embodiment of the present invention. It should be noted that, since the general configuration and operation of a liquid crystal display device, the configuration of the gate driver 400, the configuration and operation of a bistable circuit, and the configuration and operation of the clock control circuit 420 in the present embodiment are similar to those of the first embodiment, their description will not be given.

In the first embodiment, the vertical blanking period (about 8.3 msec) whose length is about 1/2 of one vertical scanning period is provided, and the drive frequency in the write period is set to 120 Hz (about 8.3 msec) which is twice as high as the general drive frequency (60 Hz). On the other hand, in the present embodiment, as illustrated in FIG. 24, the vertical blanking period (about 5.6 msec) whose length is about 1/3 of one vertical scanning period is provided, and the drive frequency in the write period is set to 90 Hz (about 11.1 msec) which is 1.5 times as high as the general drive frequency. That is, in the present embodiment, the length of the vertical blanking period is about 1/2 of that of the write period. It should be noted that, since the operation in the write period and the vertical blanking period in the present embodiment is similar to that in the first embodiment, its description will not be given.

4.2 Effect

According to the present embodiment, the potential of the second node N2 in each stage becomes the high level in the write period except for the set period and the selection period in the stage and becomes the low level in the set period, the selection period, and the vertical blanking period including the pause period in the stage. In the present embodiment, the length of the vertical blanking period is about 1/2 of that of the write period. Consequently, the duty ratio of the potential of the second node N2 in each stage is substantially 2/3. That is, the duty ratio of the potential supplied to the gate terminal of the thin film transistor M5 and the gate terminal of the thin film transistor M6 becomes substantially 2/3. Therefore, the threshold shift in the thin film transistors M5 and M6 is suppressed more as compared with the conventional technique. The drive frequency in the write period in the present embodiment is lower than that in the first embodiment. As a result, power consumption is further decreased, and the circuit operation is made more stable. Therefore, according to the present embodiment, while further decreasing power consumption and making the circuit operation more stable, the reliability of the thin film transistor can be made higher than that in the conventional technique.

5. Fifth Embodiment

5.1 Operation after Power-On of Gate Driver

Figure 25:
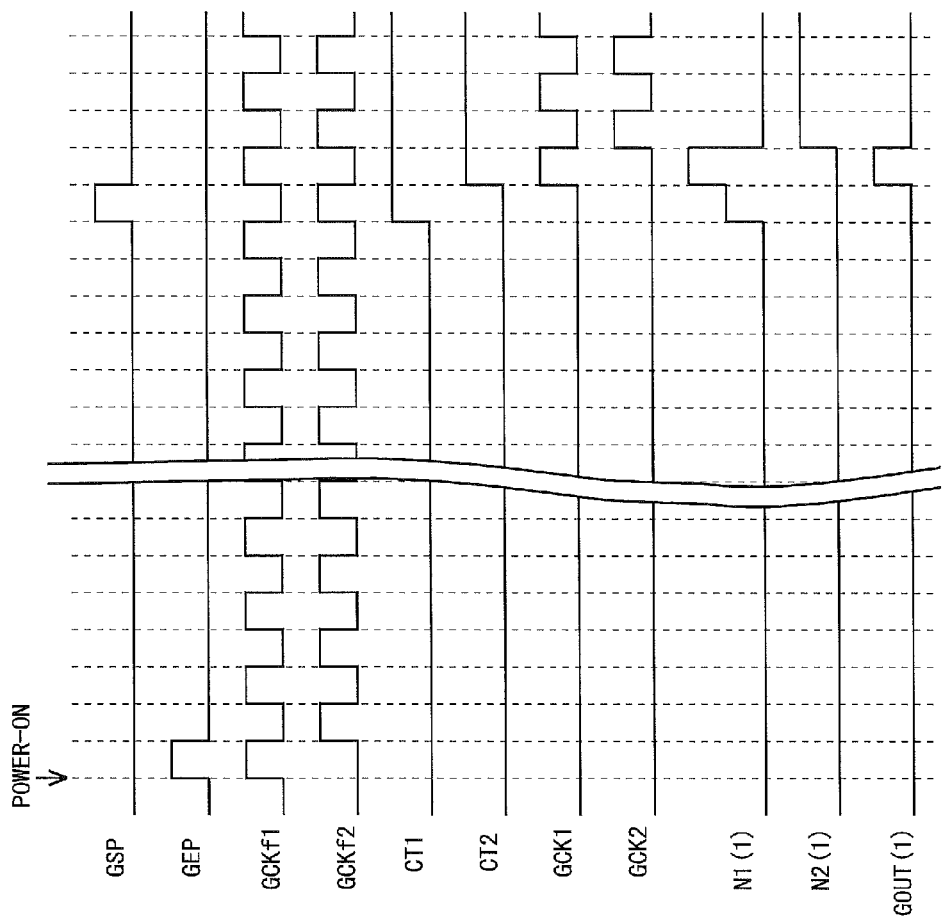
FIG. 25 is a signal waveform diagram for explaining the operation after power-on until start time point of a first vertical scanning period in a gate driver in a fifth embodiment of the present invention.

FIG. 25 is a signal waveform diagram for explaining the operation from power-on to the start time point (time point when the gate start pulse signal GSP changes from the low level to the high level for the first time) of the first vertical scanning period, in the gate driver 400 in a fifth embodiment of the present invention. It should be noted that, since the general configuration and operation of a liquid crystal display device, the configuration and operation except for just after power-on of the gate driver 400, the configuration and operation of a bistable circuit, and the configuration and operation of the clock control circuit 420 in the present embodiment are similar to those of the first embodiment, their description will not be given.

As illustrated in FIG. 25, just after power-on, supply of the first pre-control gate clock signal GCKf1 and the second pre-control gate clock signal GCKf2 to the gate driver 400 (clock output circuit 73) is started. In the present embodiment, immediately after power-on, the potential of the gate end pulse signal GEP changes from the low level to the high level. At this time, the potential of the gate start pulse signal GSP is at the low level. Consequently, the set signal of the first control signal generation circuit 71 illustrated in FIG. 12 becomes the low level, the reset signal R becomes the high level, and the first control signal CT1 as the state signal Q of the first control signal generation circuit 71 becomes the low level. Accordingly, the first input of the second control signal generation circuit 72 illustrated in FIG. 13 becomes the low level, the second input becomes the low level, and the second control signal CT2 as an output of the second control signal generation circuit 72 becomes the low level. As a result, the first post-control gate clock signal GCK1 and the second post-control gate clock signal GCK2 become the low level. That is, at this time, a state where supply of the pre-control gate clock signal GCKf to each bistable circuit is stopped is obtained. This state is maintained until the gate start pulse signal GSP changes from the high level to the low level in the write period in the first vertical scanning period.

When the potential of the gate end pulse signal GEP changes from the low level to the high level immediately after power-on, in each stage which receives the gate end pulse signal GEP as the end signal ED, the thin film transistors MA and MB enter the on state. Accordingly, the potentials of the first node N1(1) in the first stage to the first node N1(m) in the m-th stage are reset to the low level, and the potentials of the second node N2(1) in the first stage to the second node N2(m) in the m-th stage are reset to the low level.

5.2 Effects

According to the present embodiment, the potential of the first node N1 and the potential of the second node N2 which become unstable in the period from power-on until the start time point of the first vertical scanning period are reset to the low level. In the period from power-on until the start time point of the first vertical scanning period, a state where supply of the pre-control gate clock signal GCKf to each bistable circuit is stopped is obtained. Consequently, the potential of the first node N1 and the potential of the second node N2 are reliably maintained at the low level. Thus, the circuit operation can be made further more stable.

It should be noted that, in the period from power-on until the start time point of the first vertical scanning period, in place of the gate end pulse signal GEP, another signal which changes from the low level to the high level immediately after power on may be used.

6. Sixth Embodiment

6.1 Configuration and Operation of Shift Register

Figure 26:
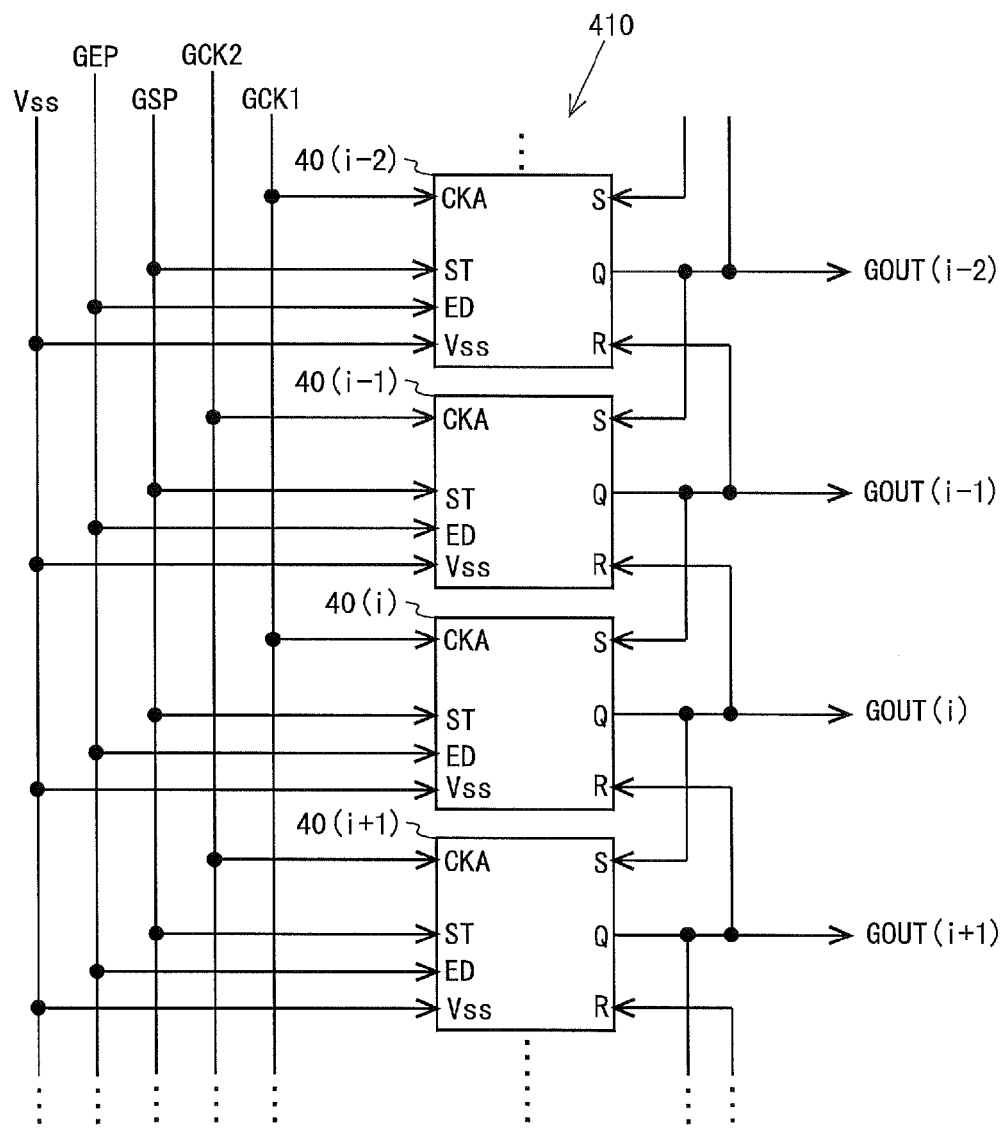
FIG. 26 is a block diagram illustrating a configuration of a shift register in a sixth embodiment of the present invention.
Figure 27:
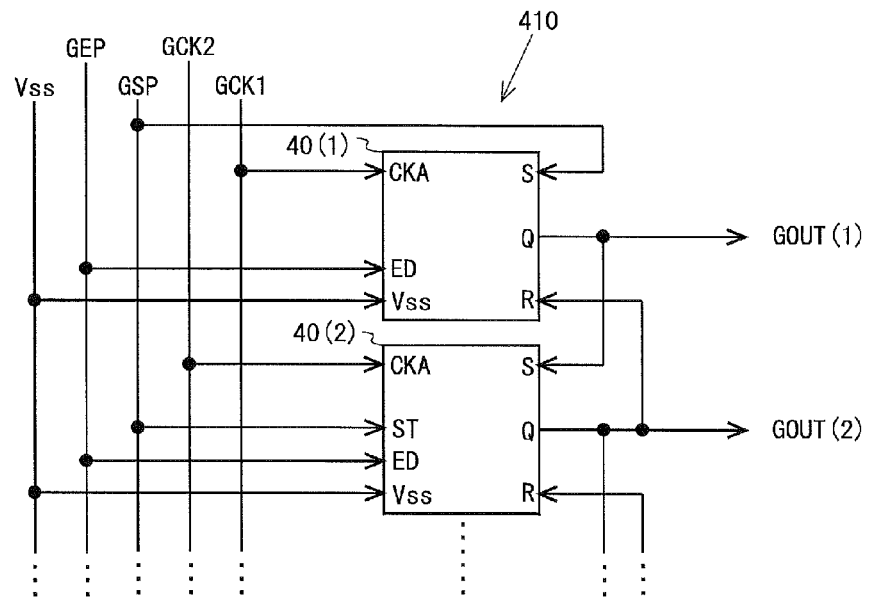
FIG. 27 is a block diagram illustrating a configuration of a front stage side of the shift register in the sixth embodiment.
Figure 28:
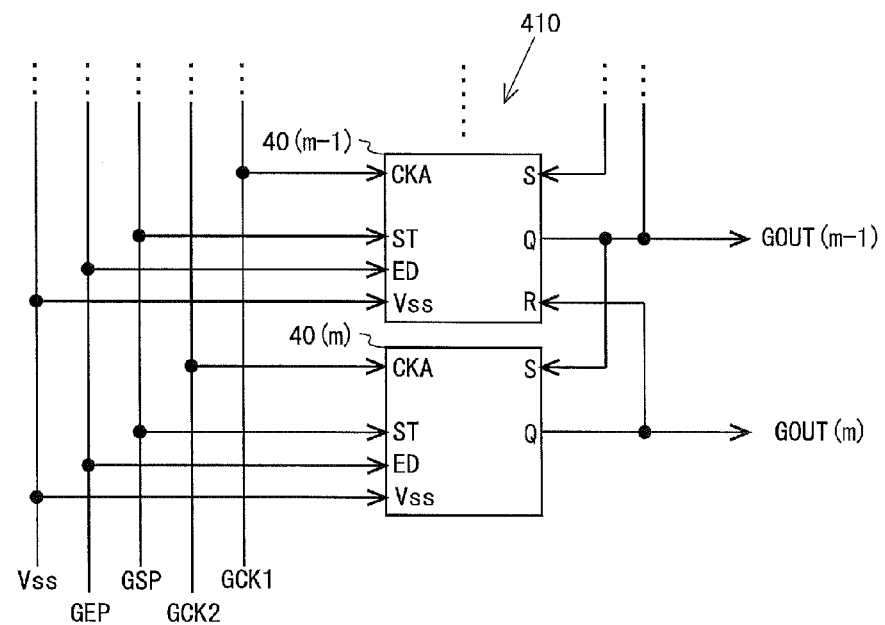
FIG. 28 is a block diagram illustrating a configuration of a final stage side of the shift register in the sixth embodiment.

FIG. 26 is a block diagram illustrating the configuration of a stage other than the front stage and the final stage of the shift register 410 in a sixth embodiment of the present invention. FIG. 27 is a block diagram illustrating the configuration of a front stage side of the shift register 410 in the present embodiment. FIG. 28 is a block diagram illustrating the configuration of a final stage side of the shift register 410 in the present embodiment. It should be noted that, since the general configuration and operation of the liquid crystal display device and the configuration and operation of the clock control circuit 420 of the present embodiment are similar to those of the first embodiment, their description will not be given.

As illustrated in FIGS. 26 to 28, each bistable circuit in the present embodiment is not provided with an input terminal for receiving the charge replenishment clock signal CKB, different from each of the bistable circuits in the first embodiment. To odd-numbered stages in the present embodiment, the first post-control gate clock signal GCK1 is supplied as the operation control clock signal CKA. To even-numbered stages in the present embodiment, the second post-control gate clock signal GCK2 is supplied as the operation control clock signal CKA. It should be noted that the other terminals (input and output terminals) of each bistable circuit in the present embodiment are similar to those in each bistable circuit in the first embodiment. The basic operation of the gate driver 400 in the present embodiment is similar to that of the gate driver 400 in the first embodiment, so that its description will not be given.

6.2 Configuration of Bistable Circuit

Figure 29:
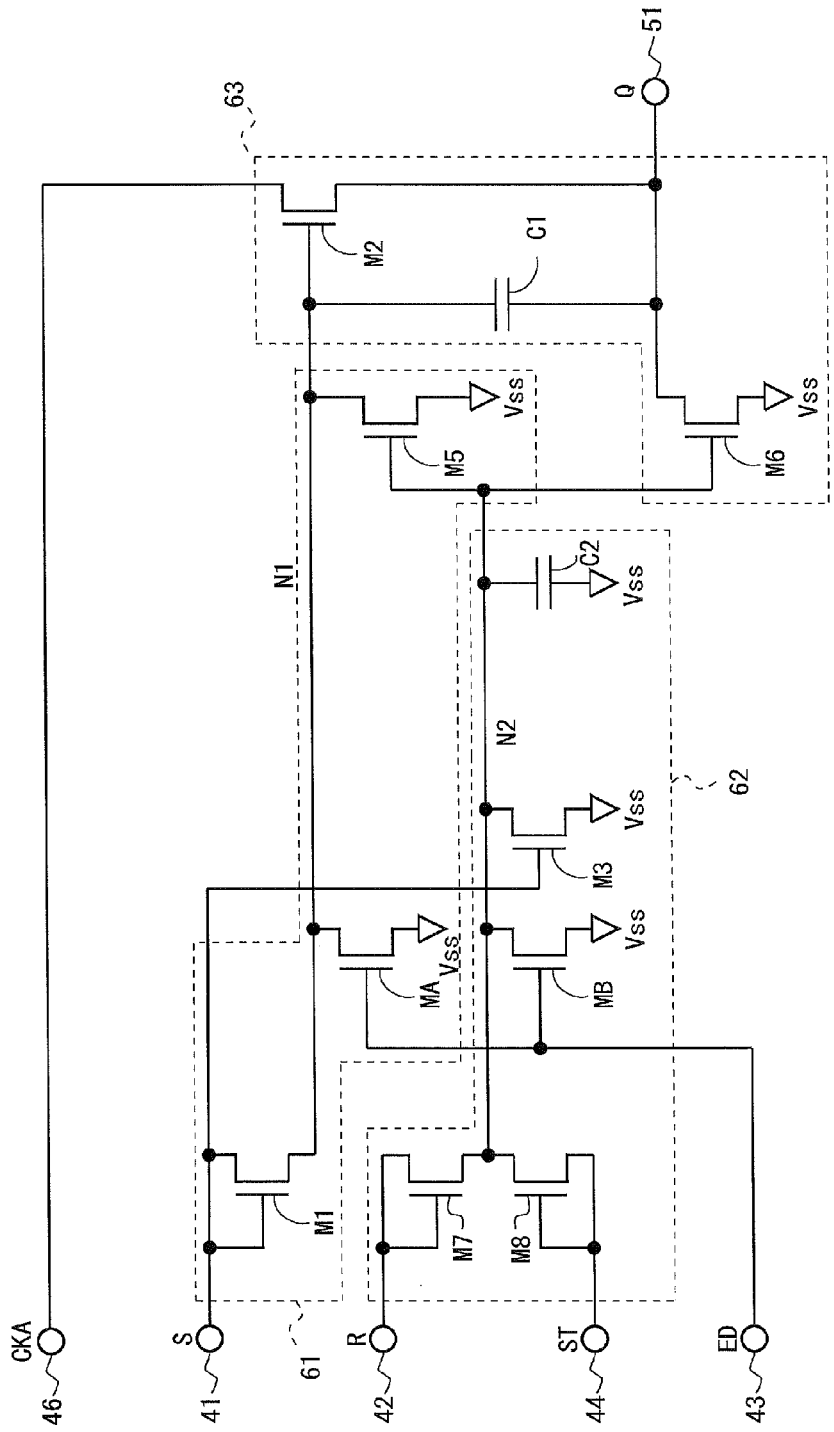
FIG. 29 is a circuit diagram illustrating a configuration of a bistable circuit in a stage other than front and final stages in the sixth embodiment.
Figure 32:
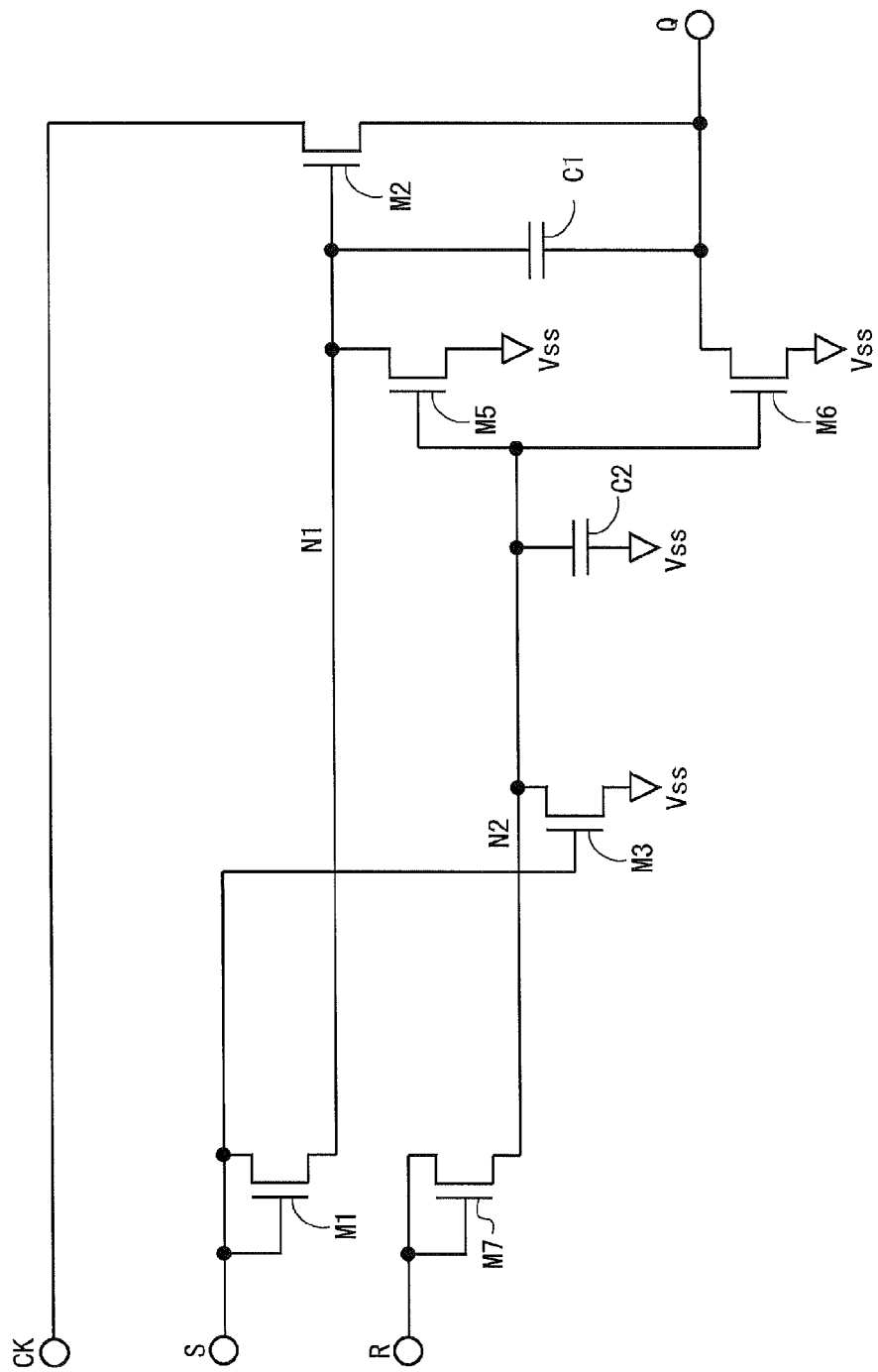
FIG. 32 is a circuit diagram illustrating the configuration of a bistable circuit in a first conventional example.
Figure 33:
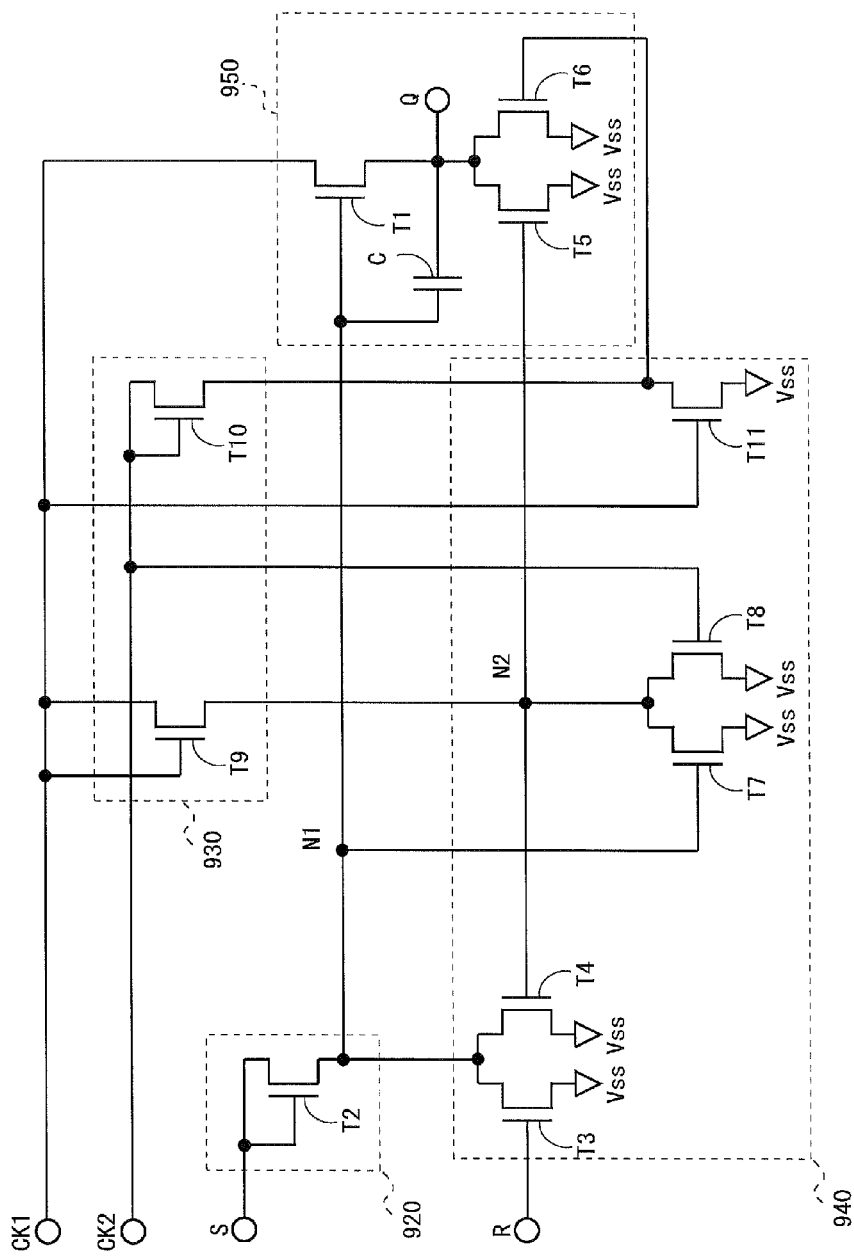
FIG. 33 is a circuit diagram illustrating the configuration of a bistable circuit in a second conventional example.

FIG. 29 is a circuit diagram illustrating the configuration of a bistable circuit in a stage other than the first stage (front stage) and the m-th stage (final stage) in the present embodiment. As illustrated in FIG. 29, the bistable circuit is obtained by adding the thin film transistors M8, MA, and MB to the bistable circuit (FIG. 32) described in Patent Document 1. Different from the bistable circuit in the first embodiment, the bistable circuit in the present embodiment is not provided with the thin film transistors M4 and M9. The bistable circuit is provided with the input terminal for the low-level DC power supply potential Vss and, in addition, five input terminals 41 to 44 and 46 and one output terminal 51. As described above, the bistable circuit is not provided with the input terminal 47 for receiving the charge replenishment clock signal CKB.

The first driving unit 61 is configured by, in a manner similar to that in the first embodiment, the three thin film transistors M1, M5, and MA. The second driving unit 62 is configured by the four thin film transistors M3, M7, M8, and MB, and one capacitor C2. The output unit 63 is configured by, in a manner similar to that in the first embodiment, the two thin film transistors M2 and M6 and one capacitor C1.

Figure 30:
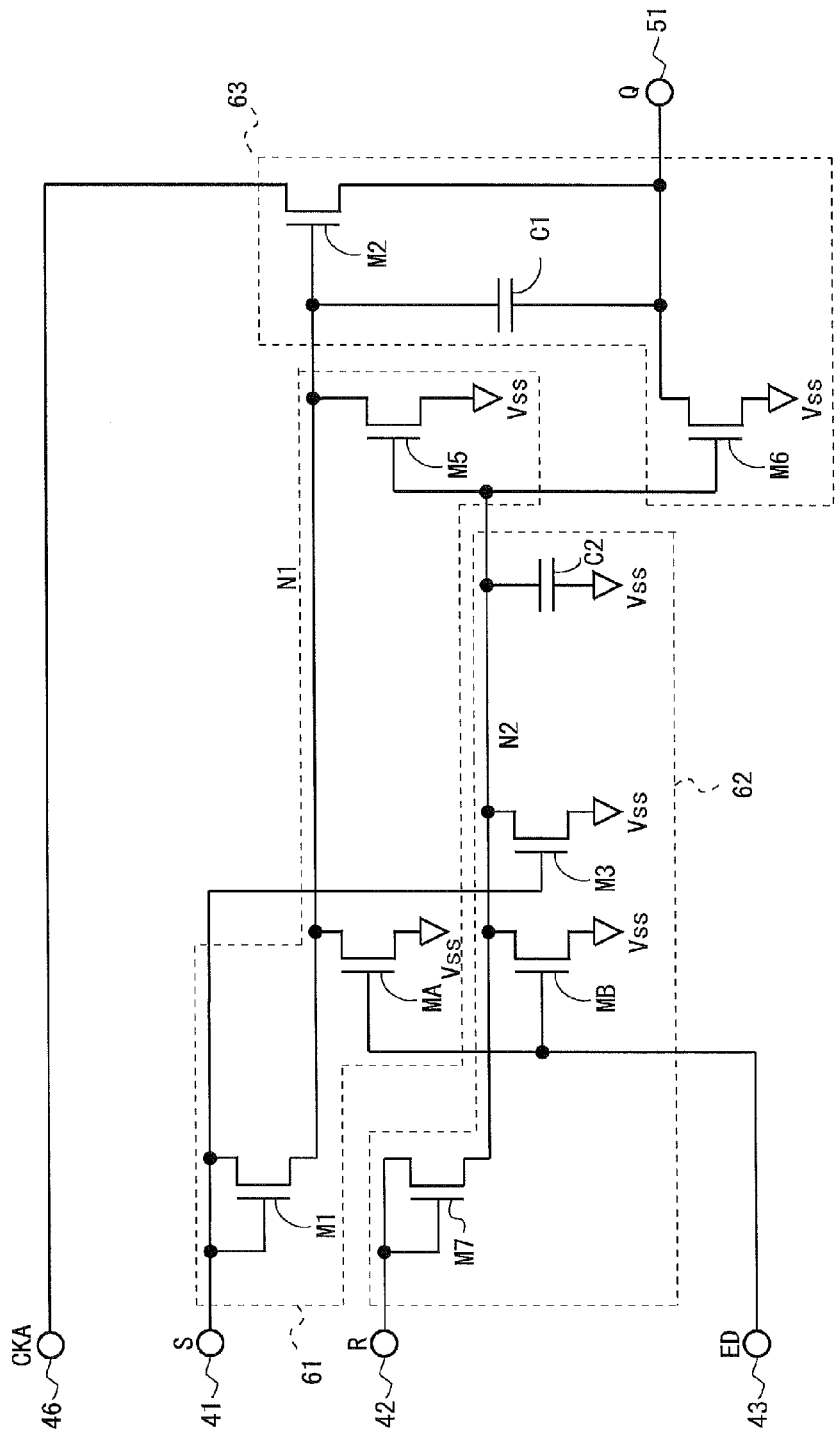
FIG. 30 is a circuit diagram illustrating a configuration of a bistable circuit in a front stage in the sixth embodiment.

FIG. 30 is a circuit diagram illustrating the configuration of a bistable circuit in the first stage (front stage) in the present embodiment. As illustrated in FIG. 30, the bistable circuit is not provided with the thin film transistor M8 and the input terminal 44, different from bistable circuits other than the first stage (front stage) and the m-th stage (final stage) illustrated in FIG. 29. It should be noted that, since the other configuration of the bistable circuit is similar to that of the bistable circuits other than the first stage (front stage) and the m-th stage (final stage) illustrated in FIG. 29, its description will not be given.

Figure 31:
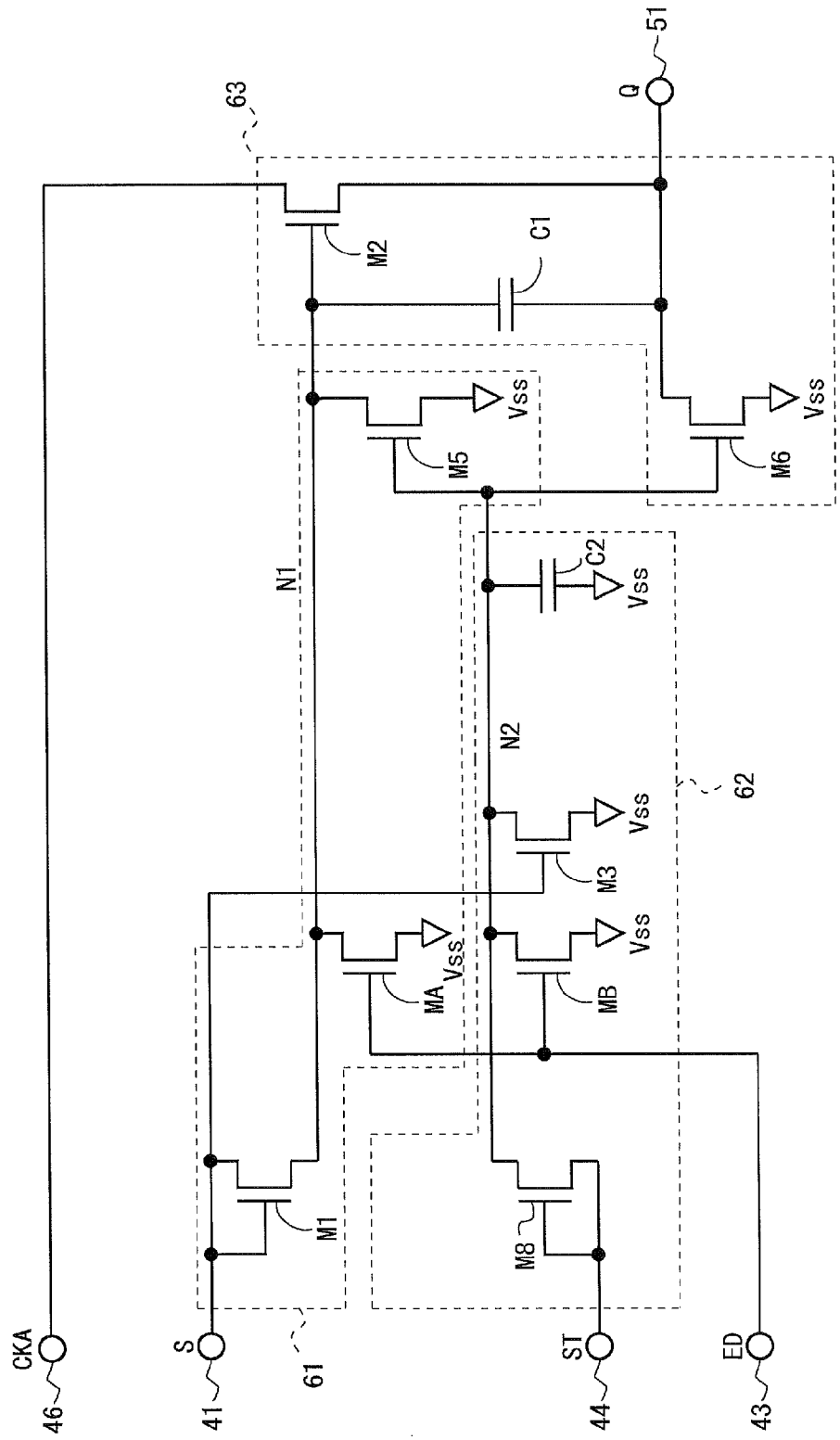
FIG. 31 is a circuit diagram illustrating a configuration of a bistable circuit in a final stage in the sixth embodiment.

FIG. 31 is a circuit diagram illustrating the configuration of the bistable circuit in the m-th stage (final stage) in the present embodiment. As illustrated in FIG. 31, the bistable circuit is not provided with the thin film transistor M7 and the input terminal 42, different from the bistable circuits other than the first stage (front stage) and the m-th stage (final stage) illustrated in FIG. 29. It should be noted that, since the other configuration of the bistable circuit is similar to that of the bistable circuits other than the first stage (front stage) and the m-th stage (final stage) illustrated in FIG. 29, its description will not be given.

Also in the present embodiment, in a manner similar to the first embodiment, the first-node-turn-on switching element is realized by the thin film transistor M1, the output control switching element is realized by the thin film transistor M2, the first second-node-turn-off switching element is realized by the thin film transistor M3, the first-node-turn-off switching element is realized by the thin film transistor M5, the output-node-turn-off switching element is realized by the thin film transistor M6, the second-node-turn-on switching element is realized by the thin film transistor M7, the start switching element is realized by the thin film transistor M8, the first end switching element is realized by the thin film transistor MA, and the second end switching element is realized by the thin film transistor MB. The capacitive element is realized by the capacitor C1.

6.3 Operation of Bistable Circuit

The basic operation of the bistable circuit in the present embodiment is similar to that in the first embodiment. Therefore, description of common operation of the present embodiment and the first embodiment will not be given, and only different points of them will be described with reference to FIG. 10.

In the first embodiment, in a normal operation period (a period before the time point t0 and a period after the time point t3 in the write period), the potential of the charge replenishment clock signal CKB repeats the high level and the low level every one horizontal period, so that the thin film transistor M9 enters the on state in one horizontal period every two horizontal scanning periods. Consequently, charges are supplied to the second node N2 via the thin film transistor M9. Consequently, in the normal operation period, the potential of the second node N2 is reliably maintained at the high level. On the other hand, in the present embodiment, the input terminal 47 for receiving the charge replenishment clock signal CKB and the thin film transistor M9 are not provided, so that charges are not supplied to the second node N2 in the normal operation period unlike the first embodiment. Therefore, stability of the potential of the second node N2 in the normal operation period in the present embodiment is the same as that in the conventional technique.

In the first embodiment, in the selection period (at the time point t1), the potential of the state signal Q becomes the high level, so that the thin film transistor M4 enters the on state. Consequently, the potential of the second node N2 reliably becomes the low level in the selection period. On the other hand, in the present embodiment, the thin film transistor M4 is not provided, so that the operation for reliably changing the potential of the second node N2 to the low level is not performed in the selection period. Therefore, the potential of the second node N2 in the selection period in the present embodiment is the same as that in the conventional technique.

It should be noted that, since detailed operation of the gate driver in the present embodiment is also similar to that in the first embodiment except for the point that the potential of the second node N2 in the normal operation period and the selection period becomes easily unstable, its description will not be given. As described above, in the present embodiment, the potential of the second node N2 in the normal operation period and the selection period is more unstable than that in the first embodiment, so that noise occurs more easily in the potential of the first node N1 and the potential of the state signal Q (scanning signal). That is, in the present embodiment, the circuit operation easily becomes unstable.

6.4 Effects

However, also in the present embodiment, the threshold shift of the thin film transistors M5 and M6 is suppressed more than that in the conventional technique, and the number of thin film transistors each having a source terminal to which the clock signal is supplied is smaller than that in the conventional technique. As a result, while suppressing power consumption, the reliability of the thin film transistors M5 and M6 can be increased. In addition, according to the present embodiment, in a manner similar to the first embodiment, by increasing the reliability of the thin film transistors M5 and M6, the size of the thin film transistors M5 and M6 can be made small. In the case where the size of the thin film transistors M5 and M6 is made small, the power consumption is further reduced, and the picture-frame area of the liquid crystal display device having the gate driver 400 can be reduced.

It should be noted that the configuration may be such that the thin film transistor MA is not provided in the first stage 40(1) to the (m−1)th stage 40(m−1) like in the modification of the first embodiment. In this case, the number of thin film transistors is further reduced, so that the power consumption can be further reduced, and the picture-frame area of the liquid crystal display device having the gate driver 400 can be further reduced.

7. Others

The configuration of the gate driver 400 in the present invention is not limited to that in each of the foregoing embodiments. That is, the configuration may be such that the gate driver 400 has at least the thin film transistors M5 and M6 in each bistable circuit, a vertical blanking period longer than two horizontal scanning periods is provided, supply of a clock signal to each bistable circuit is stopped in the vertical blanking period, and the potential of the first node connected to the drain terminal of the thin film transistor M5 and the potential of the second node N2 connected to the gate terminals of the thin film transistors M5 and M6 are maintained at the off level in the vertical blanking period. For example, a configuration obtained by adding the thin film transistors M8, MA, and MB in the first embodiment to the second conventional example may be employed. It should be noted that, in the second conventional example, the transistors T4 and T5 correspond to the thin film transistors M5 and M6 in the present invention. The first driving unit 61 is realized by the input unit 920, the second driving unit 62 is realized by the pull-down driving unit 940, and the output unit 63 is realized by the output unit 450. In such a configuration, when the length of the write period and the length of the vertical blanking period are set similar to those in the first embodiment, a potential whose duty ratio is substantially 1/4 is supplied to the gate terminals of the transistors T4 and T5 to which the second node N2 is connected. Consequently, in such a configuration, the threshold shift which occurs in the transistors T4 and T5 can be suppressed more than that in the second conventional example. However, in such a configuration, the duty ratio of the potential of the second node N2 in the write period is 1/2 (when the length of the write period and the length of the vertical blanking period are similar to those in the first embodiment, the duty ratio is 1/4), so that noise caused by potential fluctuation in the second node N2 occurs in the potential of the first node N2 and the potential of the state signal Q. Therefore, stability of the circuit operation is lower than that of the first embodiment.

Although supply of a clock signal to each bistable circuit is stopped in the vertical blanking period in the foregoing embodiments, the present invention is not limited to this. Without stopping supply of the clock signal to each bistable circuit in the vertical blanking period, the threshold shift in the transistors M5 and M6 can be suppressed more than that in the conventional technique.

In the first to fourth embodiments, the length of the vertical blanking period is set to about 1/2, about 2/3, about 3/4, and about 1/3 of the length of one vertical scanning period. Thus, from the viewpoint of increasing the reliability of thin film transistors, desirably, the length of the vertical blanking period is sufficiently long.

The drive frequencies in the foregoing embodiments and modifications are examples and can be variously changed.

Although supply of clock signals to bistable circuits is controlled by the clock control circuit 420 in the foregoing embodiments, the present invention is not limited to this. For example, the configuration may be such that the above-described clock control circuit 420 is not provided in the gate driver 400 and the display control circuit 200 directly generate clock signals corresponding to the above-described first post-control gate clock signal GCK1 and the above-described second post-control gate clock signal GCK2 and supply the generated clock signals to a bistable circuit.

Although the clock control circuit 420 in each of the foregoing embodiments controls supply of the pre-control gate clock signal GCKf based on the gate start pulse signal GSP and the gate end pulse signal GEP, the present invention is not limited to the manner. In the case where the length of the vertical blanking period is determined preliminarily, in place of the gate start pulse signal GSP, the gate end pulse signal GEP delayed only by length of the vertical blanking period may be supplied to the first control signal generation circuit 71 and the second control signal generation circuit 72. The configuration of the clock control circuit 420 is not particularly limited.

Although one clock control circuit 420 is provided in the gate driver 400 in each of the foregoing embodiments, the present invention is not limited to this. For example, a circuit corresponding to the clock control circuit 420 may be provided in each bistable circuit.

Although each of the foregoing embodiments has been described that all of the thin film transistors provided in bistable circuits are of the n-channel type, the present invention is not limited to this. The present invention can be applied also to the case where thin film transistors provided in bistable circuits are of the p-channel type.

Although the liquid crystal display device has been described as an example in each of the foregoing embodiments, the present invention is not limited to this. The present invention can be also applied to other display devices such as an organic EL (Electro Luminescence) display device. In addition, each of the foregoing embodiments can be variously modified without departing from the gist of the present invention and executed.

Consequently, the present invention can provide the scanning signal line drive circuit with increased reliability of a switching element while reducing power consumption, the display device having the same, and the driving method for scanning signal lines.

INDUSTRIAL APPLICABILITY

The present invention can be applied to a scanning signal line drive circuit, a display device having the same, and a driving method for a scanning signal line by the scanning signal line drive circuit and, particularly, is suitable to a scanning signal line drive circuit which is monolithically fabricated, a display device having the same, and a driving method for a scanning signal line by the scanning signal line drive circuit.

DESCRIPTION OF REFERENCE CHARACTERS

40(1) to 40(m): BISTABLE CIRCUIT
41 to 44, 46, 47: INPUT TERMINAL
51: OUTPUT TERMINAL (OUTPUT NODE)
61: FIRST DRIVING UNIT
62: SECOND DRIVING UNIT
63: OUTPUT UNIT
71: FIRST CONTROL SIGNAL GENERATION CIRCUIT
72: SECOND CONTROL SIGNAL GENERATION CIRCUIT
73: CLOCK OUTPUT CIRCUIT
73a: FIRST AND CIRCUIT
73b: SECOND AND CIRCUIT
200: DISPLAY CONTROL CIRCUIT
300: SOURCE DRIVER (VIDEO SIGNAL LINE DRIVE CIRCUIT)
400: GATE DRIVER (SCANNING SIGNAL LINE DRIVE CIRCUIT)
410: SHIFT REGISTER
420: CLOCK CONTROL CIRCUIT
600: DISPLAY UNIT
C1, C2: CAPACITOR (CAPACITIVE ELEMENT)
M1 to M10, MA, AND MB: THIN FILM TRANSISTOR (SWITCHING ELEMENT)

N1: FIRST NODE
N2: SECOND NODE
GCKf1: FIRST PRE-CONTROL GATE CLOCK SIGNAL
GCKf2: SECOND PRE-CONTROL GATE CLOCK SIGNAL
GCK1: FIRST POST-CONTROL GATE CLOCK SIGNAL
GCK2: SECOND POST-CONTROL GATE CLOCK SIGNAL
GSP: GATE START PULSE SIGNAL
GEP: GATE END PULSE SIGNAL
CKA: OPERATION CONTROL CLOCK SIGNAL
CKB: CHARGE REPLENISHMENT CLOCK SIGNAL
S: SET SIGNAL
R: RESET SIGNAL
ST: START SIGNAL
ED: END SIGNAL
GOUT(1) to GOUT(m): SCANNING SIGNALS
Vss: LOW-LEVEL DC POWER SUPPLY POTENTIAL

The invention claimed is:

1. A scanning signal line drive circuit driving a plurality of scanning signal lines,
the scanning signal line drive circuit comprising:
a shift register including a plurality of bistable circuits which are cascade-connected to one another and sequentially making output signals of the plurality of bistable circuits active based on a clock signal which is supplied from the outside and periodically repeats an on level and an off level, wherein
each of the bistable circuits comprises:
a first driving unit connected to a first node and changing potential of the first node based on a signal received;
a second driving unit connected to a second node and changing potential of the second node based on a signal received; and
an output unit connected to the first node and the second node and, when the potential of the first node is at the on level, the potential of the second node is at the off level, and the potential of the signal received by the first driving unit is at the off level,
outputting the output signal which is active based on the clock signal,
the first driving unit has a first-node-turn-off switching element having a control terminal connected to the second node, a conduction terminal connected to the first node, and another conduction terminal to which off-level potential is supplied,
the output unit has an output-node-turn-off switching element having a control terminal connected to the second node, a conduction terminal connected to an output node for outputting the output signal, and another conduction terminal to which off-level potential is supplied,
the first driving unit and the second driving unit maintain the potential of the first node and the potential of the second node at off level, respectively, in a predetermined period of two horizontal scanning periods or longer in each vertical scanning period,
supply of the clock signal to the plurality of bistable circuits stops in the predetermined period,
the first driving unit in a bistable circuit in a final stage further comprises a first end switching element having a control terminal to which an end signal whose potential becomes an on level to make the output signal of the bistable circuit in the final stage in the shift register the first node and another conduction terminal to which off-level potential is supplied, and
the second driving unit in each bistable circuit comprises a second end switching element having a control terminal to which the end signal is supplied, a conduction terminal connected to the second node, and another conduction terminal to which off-level potential is supplied.

2. The scanning signal line drive circuit according to claim 1, wherein
the longer the predetermined period is, the higher the frequency of the clock signal is.

3. The scanning signal line drive circuit according to claim 1, wherein
the first driving unit and the second driving unit further maintain the potential of the first node and the potential of the second node at the off level, respectively, during a period from power-on until start of a first vertical scanning period, and
supply of the clock signal to the plurality of bistable circuits further stops during a period from power-on until start of the first vertical scanning period.

4. The scanning signal line drive circuit according to claim 1, further comprising a clock control circuit which stops supply of the clock signal to the plurality of bistable circuits in the predetermined period based on the end signal.

5. The scanning signal line drive circuit according to claim 1, wherein
the first driving unit in the bistable circuit in each of the stages other than the final stage further comprises the first end switching element.

6. The scanning signal line drive circuit according to claim 1, wherein
the second driving unit in the bistable circuit in each of the stages other than the front stage further comprises a start switching element which changes the potential of the second node toward the on level based on a start signal which becomes the on level at a start timing of each vertical scanning period.

7. The scanning signal line drive circuit according to claim 6, wherein the first driving unit further comprises a first-node-turn-on switching element which changes the potential of the first node toward the on level based on a set signal,
the set signal in the bistable circuit in the front stage is the start signal, and
the set signal in a bistable circuit other than the front stage is an output signal of a pre-stage bistable circuit of the bistable circuit.

8. The scanning signal line drive circuit according to claim 7, wherein the output unit further comprises:
an output control switching element having a control terminal connected to the first node, a conduction terminal to which the clock signal is supplied, and another conduction terminal connected to the output node; and
a capacitive element having an end to which the control terminal of the output control switching element is connected and another end connected to the output node.

9. The scanning signal line drive circuit according to claim 8, wherein
the second driving unit further comprises a second-node-turn-off switching element having a conduction terminal connected to the second node and another conduction terminal to which off-level potential is supplied.

10. The scanning signal line drive circuit according to claim 9, wherein
the second driving unit is provided with, as the second-node-turn-off switching element,
a first second-node-turn-off switching element having a control terminal to which the set signal is supplied, a conduction terminal connected to the second node, and another conduction terminal to which off-level potential is supplied, and a second second-node-turn-off switching element having a control terminal connected to the output node, a conduction terminal connected to the second node, and another conduction terminal to which off-level potential is supplied.

11. The scanning signal line drive circuit according to claim 9, wherein the control terminal of the second-node-turn-off switching element is connected to the first node.

12. The scanning signal line drive circuit according to claim 9, wherein the second driving unit in a bistable circuit in each of the stages other than the front stage further comprises a second-node-turn-on switching element which changes the potential of the second node toward the on level based on an output signal of a post-stage bistable circuit of the bistable circuit.

13. The scanning signal line drive circuit according to claim 9, wherein the clock signal comprises a first clock signal and a second clock signal whose phases are deviated from each other only by one horizontal scanning period, the first clock signal is supplied to one conduction terminal of the output control switching element, and the second driving unit further comprises a charge replenishment switching element which changes the potential of the second node toward the on level based on the second clock signal.

14. A display device comprising:

a display unit in which a plurality of scanning signal lines are disposed;

a scanning signal line drive circuit for driving the plurality of scanning signal lines; and a display control circuit supplying a clock signal which periodically repeats an on level and an off level, to the scanning signal line drive circuit, wherein the scanning signal line drive circuit includes a shift register having a plurality of bistable circuits which are cascade-connected to one another and sequentially making output signals of the plurality of bistable circuits active based on the clock signal, each of the bistable circuits comprises:

a first driving unit connected to a first node and changing potential of the first node based on a signal received;

a second driving unit connected to a second node and changing potential of the second node based on a signal received; and an output unit connected to the first node and the second node and, when the potential of the first node is at the on level, the potential of the second node is at the off level, and the potential of the signal received by the first driving unit is at the off level, outputting the output signal which is active based on the clock signal, the first driving unit has a first-node-turn-off switching element having a control terminal connected to the second node, a conduction terminal connected to the first node, and another conduction terminal to which off-level potential is supplied, the output unit has an output-node-turn-off switching element having a control terminal connected to the second node, a conduction terminal connected to an output node for outputting the output signal, and another conduction terminal to which off-level potential is supplied, the first driving unit and the second driving unit maintain the potential of the first node and the potential of the second node at off level, respectively, in a predetermined period of two horizontal scanning periods or more in each vertical scanning period, supply of the clock signal to the plurality of bistable circuits stops in the predetermined period, the first driving unit in a bistable circuit in a final stage further comprises a first end switching element having a control terminal to which an end signal whose potential becomes an on level to make the output signal of the bistable circuit in the final stage in the shift register inactive after the output signal becomes active is supplied, a conduction terminal connected to the first node, and another conduction terminal to which off-level potential is supplied, and the second driving unit in each bistable circuit comprises a second end switching element having a control terminal to which the end signal is supplied, a conduction terminal connected to the second node, and another conduction terminal to which off-level potential is supplied.

15. The display device according to claim 14, wherein the scanning signal line drive circuit further comprises a clock control circuit which stops supply of the clock signal to the plurality of bistable circuits in the predetermined period based on an end signal whose potential becomes on level to make the output signal of a bistable circuit in a final stage in the shift register inactive after the output signal becomes active.

16. The display device according to claim 14, wherein the display control circuit stops supply of the clock signal to the plurality of bistable circuits in the predetermined period.

17. A driving method for a plurality of scanning signal lines by a scanning signal line drive circuit comprising a shift register including a plurality of bistable circuits which are cascade-connected to one another and sequentially making output signals of the plurality of bistable circuits active based on a clock signal which is supplied from the outside and periodically repeats an on level and an off level, the driving method comprising the steps of:

receiving a signal by each of the bistable circuits and, based on the signal, changing the potential of a first node in the bistable circuit;

receiving a signal in each of the bistable circuits and, based on the signal, changing the potential of a second node in the bistable circuit; and outputting the output signal which is active when the potential of the first node is at the on level, the potential of the second node is at the off level, and the potential of a signal received by each bistable circuit in the step of changing the potential of the first node is at the off level, wherein a bistable circuit in a final stage in the shift register comprises a first end switching element having a control terminal to which an end signal whose potential becomes an on level to make the output signal of the bistable circuit in the final stage in the shift register inactive after the output signal becomes active is supplied, a conduction terminal connected to the first node, and another conduction terminal to which off-level potential is supplied, each bistable circuit comprises:

a first-node-turn-off switching element having a control terminal connected to the second node, a conduction terminal connected to the first node, and another conduction terminal to which off-level potential is supplied;

an output-node-turn-off switching element having a control terminal connected to the second node, a conduction terminal connected to an output node for outputting the output signal, and another conduction terminal to which off-level potential is supplied, and a second end switching element having a control terminal to which the end signal is supplied, a conduction terminal connected to the second node and another conduction terminal to which off-level potential supplied, in the step of changing the potential of the first node, the potential of the first node is maintained at off level in a predetermined period of more than two horizontal scanning periods in each vertical scanning period, in the step of changing the potential of the second node, the potential of the second node is maintained at the off level in the predetermined period, and supply of the clock signal to the plurality of bistable circuits stops in the predetermined period.

* * * * *